United States Patent [19]
Nakajima

[11] Patent Number: 5,412,600
[45] Date of Patent: May 2, 1995

[54] NON-VOLATILE SEMICONDUCTOR DEVICE WITH SELECTING TRANSISTOR FORMED BETWEEN ADJACENT MEMORY TRANSISTORS

[75] Inventor: Moriyoshi Nakajima, Hyogo, Japan

[73] Assignee: Mitsubishi Denki Kabushiki Kaisha, Tokyo, Japan

[21] Appl. No.: 958,060

[22] Filed: Oct. 8, 1992

[30] Foreign Application Priority Data

Oct. 9, 1991 [JP] Japan .................. 3-261869
Oct. 2, 1992 [JP] Japan .................. 4-263984

[51] Int. Cl.6 .............................. G11C 11/40
[52] U.S. Cl. .................. 365/185; 257/314; 257/315
[58] Field of Search ............ 365/185; 257/314, 315

[56] References Cited

U.S. PATENT DOCUMENTS

| | | | |
|---|---|---|---|
| 4,527,259 | 7/1985 | Watanabe | 365/185 |
| 4,797,856 | 1/1989 | Lee et al. | 365/185 |
| 4,868,619 | 9/1989 | Mukherjee et al. | |
| 4,990,979 | 2/1991 | Otto | 365/185 |
| 5,021,999 | 6/1991 | Kohda et al. | 365/185 |
| 5,051,796 | 9/1991 | Gill | 365/185 |
| 5,278,439 | 1/1994 | Ma et al. | 257/315 |

FOREIGN PATENT DOCUMENTS 55-43862  3/1980  Japan .................. 257/315

OTHER PUBLICATIONS

IBM Technical Disclosure Bulletin vol. 35 No. 4B Sep. 1992 pp. 130–131.
"An In-System Reprogrammable 32K×8 CMOS Flash Memory", by Virgil N. Kynett et al., IEEE Journal of Solid-State Circuits, vol. 23, No. 5, Oct. 1988, pp. 1157–1163.
Nonvolatile Memories, "An Experimental 4 Mb CMOS EEPROM with a NAND Structured Cell", by Yasuo Itoh et al., 1989 IEEE International Solid-State Circuits Conference, pp. 134–135.

Primary Examiner—Viet Q. Nguyen
Assistant Examiner—F. Niranjan
Attorney, Agent, or Firm—Lowe, Price, LeBlanc & Becker

[57] ABSTRACT

An EEPROM enabling high density integration with less power consumption includes source/drain regions formed on the main surface of a P type silicon substrate, and a pair of memory transistors formed therebetween, and a selecting transistor formed between memory transistors and on the main surface of the P type semiconductor substrate. Memory transistors include control gates, and floating gates, respectively. Writing and erasure of data are conducted taking advantage of F-N tunnel phenomenon through tunnel regions.

22 Claims, 24 Drawing Sheets

| ELEMENT | ERASE | WRITE | READ |
|---|---|---|---|
| CONTROL GATE 7a | 20V | 0V | 0V |
| 1st SOURCE/DRAIN DIFFUSION LAYER 41 | 0V | 20V | 1V |
| FLOATING GATE 14a | ELECTRONS INJECTED | ELECTRONS PULLED OUT | — |
| CONTROL GATE 7b | 20V | 0V | 5V |
| 2nd SOURCE/DRAIN DIFFUSION LAYER 42 | 0V | 20V | 0V |
| SELECTING GATE ELECTRODE 4 | — | — | 5V |
| THRESHOLD VOLTAGE OF MEMORY TR. | 2~3V | -3V | — |

NON-VOLATILE SEMICONDUCTOR DEVICE WITH SELECTING TRANSISTOR FORMED BETWEEN ADJACENT MEMORY TRANSISTORS

BACKGROUND OF THE INVENTION

1. Field of the Invention

The present invention relates generally to an electrically erasable and programmable non-volatile read only memory (hereinafter abbreviated as EEPROM), and more specifically, to a non-volatile semiconductor device permitting miniaturization and high density integration.

2. Description of the Background Art

FIG. 19 is a block diagram showing a conventional EEPROM, writing and erasure of information to and from which can be performed electrically.

Referring to FIG. 19, the EEPROM includes a memory cell array 50 including EEPROM cells, a row address buffer 51 for receiving an externally applied row address signal, a column address buffer 52 for receiving a column address signal, a row decoder 53 and a column decoder 54 for decoding these address signals, and for applying voltage to a word line and a bit line connected to a designated memory cell, a sense amplifier 56 for reading a signal stored in the memory cell designated by the two decoders through a Y gate 55, an output buffer 57 for outputting the read signal, and a control signal input buffer 58 for receiving an externally applied control signal to apply the same to each element of the device.

In operation, sense amplifier 56 detects a signal stored in a memory cell, and amplifies the signal to apply the amplified signal to output buffer 57. FIG. 20 is a circuit diagram showing examples of memory cell arrays 50 and Y gate 55 shown in FIG. 19.

Referring to FIG. 20, Y gate 55 includes a transistor 60 connected between an I/O line 59 and a bit lines 31, and a transistors 63 connected between a CG line 61 and a control gate line 62. A Y gate signal Y2 is applied to the gates of transistors 60 and 63. A transistor to which a Y gate signal Y1 is applied has a similar connection.

Memory cells of 4 bits are shown in memory cell array 50. One memory cell includes a memory transistors 6 having a floating gate, and a selecting transistors 3 with its gate connected to a word line 32 for applying a signal stored in memory transistor 6 to bit lines 31. Another transistor 3a has such a connection that its gate is connected to word line 32 and applies a signal from control gate line 62 to memory transistor 6.

In operation, memory transistor 6 stores a binary signal depending upon whether electrons are stored in its floating gate or not. If electrons are stored, the threshold voltage of memory transistors 6 increases. This causes memory transistor 6 to be turned off in its reading operation. If electrons are not stored, the threshold voltage of memory transistor 6 is pulled to negative. This results in turning on of memory transistor 6 in its reading operation.

Voltage for use in reading from sense amplifier 56 is applied to bit line 31 through transistor 60, and the voltage is further applied to memory transistor 6 through selecting transistor 3. This enables detection in the sense amplifier as to whether or not current flows through memory transistor 6, and, therefore, the signals stored in the memory transistor 6 can be read out.

FIG. 21 is a view showing a conventional EEPROM having a floating gate.

(A) is a top plan view, and (B) is a sectional view taken along line B—B in (A). Description will be provided on the structure of the EEPROM in conjunction with FIG. 13.

The EEPROM includes a memory transistor 6 and a selecting transistor 3 formed on a main surface of a P type silicon semiconductor substrate 20. Memory transistor 6 includes a tunnel impurity diffusion layer 9 which is to be a drain region formed on the main surface of P type silicon substrate 20, a source region 2, a thin tunnel insulating film 16 formed in a prescribed region on tunnel impurity diffusion, layer 9, a floating gate 14 of polysilicon formed in a region including at least tunnel insulating film 16 on P type silicon substrate 20 with an insulating film therebetween, and a control gate 7 formed on floating gate 14 with an interlayer silicon oxide film 15 therebetween. Control gate 7 and floating gate 14 form capacitance in their overlapped region using interlayer silicon oxide film 15. Tunnel impurity diffusion layer 9 connected to floating gate 14 and an impurity diffusion layer for connection 5 forms capacitance in the region in which tunnel insulating film 16 is formed, using tunnel insulating film 16. Furthermore, there exists capacitance formed by floating gate 14 and semiconductor substrate 20 in the region other than tunnel insulating film 16.

Floating gate 14 stores electric charges. Discharge-/injection of electric charges takes place between floating gate 14 and the tunnel impurity diffusion layer 9 through tunnel insulating film 16 in accordance with voltage difference between the control gate 7 and impurity diffusion layer for connection 5 region. Selecting transistor 3 includes impurity diffusion layer for connection 5 and a drain region 1 formed a distance apart from each other on the main surface of semiconductor substrate 20, and a selecting gate electrode 4 to be a word line formed therebetween. A selecting gate silicon oxide film 13 is formed between selecting gate electrode 4 and the main surface of semiconductor substrate 20. Drain region 1 is connected to bit line 31 through a contact hole.

Selecting transistor 3 is turned on/off in response to a signal applied through selecting gate electrode 4. Information which is stored in memory transistor 6 connected to selecting transistor 3 is thus read out to bit line 31.

Now, description will be provided on the operation of the EEPROM. The EEPROM has three basic operation modes, reading, erasure, and writing. Table 1 sets forth voltages applied to the elements when informative charges are written, erased, and read to and from floating gates 14.

TABLE 1

| ELEMENT | READ | ERASE | WRITE |
| --- | --- | --- | --- |
| SELECTING GATE ELECTRODE 4 | 5 V | $V_{PP}$ | $V_{PP}$ |
| CONTROL GATE 7 | 0 V | $V_{PP}$ | 0 V |
| BIT LINE 31 | 1 V | 1 V | $V_{PP}$ |
| SOURCE LINE | 0 V | 0 V | FLOATING |
| FLOATING GATE 14 | $V_F$ | $V_E$ | $V_W$ |

$V_{pp}$ represents a program voltage, $V_F$ is a potential at the time of floating, and $V_w$ and $V_E$ the potentials of floating gates 14 at the time of writing and erasure operations.

As set forth in Table 1, in erasing a memory cell, $V_{pp}$ is applied to selecting gate electrode 4 and control gate 7, and bit line 31 and source line 12 are grounded. In this erasure cycle, electrons are injected through tunnel insulating film 16 from impurity diffusion layer for connection 5 into floating gate 14. As a result, negative charges are accumulated on floating gate 14.

As set forth in Table 1, in a writing operation into a memory cell, $V_{pp}$ is applied to selecting gate electrode 4 and bit line 31. Control gate 7 is grounded, and source line 12 is held at a floating state. Then, the area between drain 1 and impurity diffusion layer for connection 5 conducts, electrons are discharged from floating gate 14 through tunnel insulating film 16 based on a principle which will be described later, and positive charges are accumulated at floating gate 14. In reading, 5V is applied to selecting gate electrode 4, 1 V is applied to bit line 31, and control gate 7 and source line 12 are grounded. The channel region 10 of the memory transistor is turned on/off in response to the potential of floating gate 14. More specifically, when the memory transistor is in the state of erasure, negative charge is accumulated on floating gate 14, and channel region 10 is therefore turned off. Conversely, when the memory transistor is in the state of data written, negative charge is not accumulated on floating gate 14, and channel region 10 is therefore turned on. In this manner, the state of the memory transistor is determined.

FIG. 22 is an equivalent circuit diagram showing the EEPROM shown in FIG. 21. C1 represents a tunnel capacitance formed in the tunnel region. C2 is a capacitance comprised of loating gate 14, control gate 7, and an interlayer silicon oxide film 15 existing therebetween. C3 is a parasitic capacitance, and is comprised of floating gate 14, tunnel impurity diffusion layer 9 formed underneath, and tunnel insulating film 16 existing therebetween. FIG. 22 (A) shows a state of an EEPROM not in operation. When in the erasure mode, for example, as set forth in Table 1, $V_{pp}$ is applied to control gate 7, tunnel impurity diffusion layer 9 is grounded, and an equivalent circuit at that time is as shown in FIG. 22 (B). The potential $V_F$ at that time will be represented as follows:

$$V_F = C2/(C1+C2+C3) \cdot V_{PP} \quad (1)$$

where $C2/(C1+C2+C3)$ is referred to as a capacitive coupling ratio, and is usually around 0.7. The size of the electric field of the tunnel insulating film and the amount of current flowing through the tunnel insulating film are represented by the following equations:

$$E_{OX} = V_F/\text{TOX} \quad (2)$$

$$J = A E_{OX}^2 \exp(-(B/E_{OX})) \quad (3)$$

where $E_{OX}$ is the electric field, $T_{OX}$ is the thickness of the tunnel insulating film, J is a current, and A, B are constants.

Substituting equation (2) for equation (1) with a capacitive coupling ratio of 0.7, and $T_{OX}$ of 10 nn results in: $E_{OX} = 14$ MV/cm.

Substitution of this value for equation (3) results in a sufficiently large value, J. This is because the EEPROM is in an enhancement state. Using this value, electrons are discharged/injected between floating gate 14 and impurity region 9 on the substrate through the tunnel insulating film.

Brief description has been given on a conventional EEPROM.

Now, description will be provided on a method of manufacturing the conventional EEPROM. An oxide film 74 to be tunnel insulating film 16 is formed on P type silicon substrate 20 and polysilicon 70 is deposited thereon. Resist 77 is coated on a prescribed part on polysilicon 70 (FIG. 23 (A)).

An insulating film 80 is formed on polysilicon 70 patterned into a prescribed length, and a polysilicon layer 71 is deposited on insulating films 80 and 74. Resists 78 and 79 are coated on prescribed parts on polysilicon layer 71 (FIG. 23 (B)).

Etching is performed in this state, and a polysilicon layer is patterned, which forms selecting transistor 3 and memory transistor 6 as shown in FIG. 23 (C). Selecting transistor 3 includes selecting gate 4, and selecting gate silicon oxide film 13, while memory transistor 6 includes control gate 7, interlayer silicon oxide film 15, floating gates 14 and tunnel insulating film 16. An n type impurity is introduced in this state, forming drain region 1, source region 2 and impurity diffusion layer for connection 5.

Then, drain region 1, source region 2, and metal interconnection layers 11 and 12 are formed, and an interlayer insulating film 76 is formed, covering selecting transistor 3 and memory transistor 6 (23 (D)).

FIG. 24 is an equivalent circuit diagram in the case where the conventional EEPROM cells in FIG. 13 are arranged as memory cell array 50. Selecting transistor 3a, 3b and memory transistor 6a, 6b are disposed as shown in FIG. 24.

Now, description will be provided on a conventional flash type EEPROM. FIG. 25 is a view schematically showing the structure of a conventional flash type EEPROM. Referring to FIG. 25, the conventional flash type EEPROM includes memory transistors 82a and 82b formed a distance apart from each other on the main surface of a P type semiconductor substrate 81 with an insulating film therebetween, a source region 83 formed between memory transistors 82a and 82b and on the main surface of P type semiconductor substrate 81, and the drain regions 84a and 84b formed on the side opposing to the source 83 of memory transistors 82a and 82b. Drain regions 84a and 84b are provided with metal interconnection layers. Memory transistors 82a and 82b include floating gates 85a and 85b, and control gates 86a and 86b respectively.

The operation will be described. The conventional flash type EEPROM takes advantage of an avalanche phenomenon for writing, and a tunnel phenomenon for erasures which has been described in conjunction with the operation of the EEPROM in the foregoing. Reading is conducted in a similar manner to the case of EEPROM described above. The operation of an EEPROM is disclosed in detail, for example, in U.S. Pat. No. 4,797,856, which is incorporated herein by reference.

The size of the conventional flash type EPROM can be reduced considerably like the case of a flash type EEPROM.

Such a flash type EEPROM is described in detail, for example, in "An In-System Reprogrammable 32K×8 CMOS Flash Memory," IEEE JOURNAL OF SOLID-STATE CIRCUIT Vol. 23, No. 5, October. 1988, or in U.S. Pat. No. 4,868,619 which is incorporated herein by reference.

Having such a configuration, a conventional EEPROM requires one selecting transistor each for one memory cell in order to write, erase and read data on a bit-unit basis. Consequently, the cell area must be expanded, thus hindering the high density integration.

In the case of a flash type EEPROM permitting higher density integration, an electrically erasable non-volatile semiconductor memory device can be provided without requiring a selecting transistor, taking advantage of avalanche phenomenon for writing. More specifically, referring to FIGS. 25A and 25B, at the time of writing data into memory transistor 82a, a pulse of about 8 V is applied to drain 84a for about 10 μsec, with a high voltage of about 12 V being applied to control gate 86a, and source 83 and substrate 81 being grounded. At that time, avalanche phenomenon takes place at the end of the drain 84a of the channel portion underlying floating gate 85a, and a large amount of current flows from drain 84a to source 83 and substrate 81. At that time, a part of electrons is attracted into floating gate 85a by the potential of floating gate 85a induced by the potential of control gate 86 a. This writing operation results in inefficient writing and large power consumption. Also, without a selecting transistor, at the time of erasing data by means of tunnel phenomenon between floating gate 85a and source 83, certain means is necessary for preventing memory transistor 82a from attaining a depletion state, in other words an excessive erasure state resulting in difficulty in the associated circuitry.

As a result, strict control of conditions in the manufacture will be needed and a special complicated erase method is used to avoid overerase. Typically several erasure pulses are generated, and additionally, memory test is checked for providing a device with balanced characteristics. As a result, the cost of EEPROM is pushed up.

SUMMARY OF THE INVENTION

It is therefore an object of the present invention to achieve high density integration more easily and to reduce power consumption in one EEPROM capable of writing, erasing and reading data on a bit unit basis.

Another object of the present invention is to simplify the circuitry and reduce cost in EEPROM.

Yet another object of the present invention is to facilitate a method of operation in an EEPROM which can readily be highly integrated and operated with reduced power consumption.

A still further object of the present invention is to facilitate a method of manufacture in an EEPROM which can readily be highly integrated and can operate with reduced power consumption.

The above-described objects of the present invention can be achieved by an EEPROM including the following elements. More specifically, an EEPROM in accordance with the present invention includes a semiconductor substrate having a main surface, a pair of memory transistors each including a floating gate and a control gate formed on the main surface of the semiconductor substrate and a distance apart from each other, and a selecting transistor formed on the main surface and in the space between the pair of memory transistors.

Only one selecting transistor is used for a pair of transistors, which is not of flash type, and, therefore, does not consume electric power very much. Consequently, high density integration and reduction of power consumption can be readily achieved in the EEPROM capable of writing, erasure and reading on bit-by-bit basis.

In another aspect of the present invention, a method of operation in an EEPROM having first and second memory cells formed spaced apart from each other on the main surface of the semiconductor substrate, each of which includes a floating gate for storing information charges and a control gate for controlling the state of the floating gate, and one selecting transistor between the first and second memory cells and on the main surface of the semiconductor substrate for selecting the first or second memory cells includes the following steps. In its erasure mode, a prescribed first potential is applied to the control gate of the memory cell whose data is to be erased, and a prescribed second potential lower than the prescribed first potential is applied to the source-drain region of the memory cell whose data is to be erased, whereby charges are injected into the floating gate of the memory cell whose data is to be erased. In the writing mode, a prescribed third potential is applied to the control gate of the memory cell to which data is written, and a prescribed fourth potential higher than the prescribed third potential is applied to the source-drain region of the memory cell to which data is written, whereby charges are discharged from the floating gate of the memory cell to which data is written, while in the reading mode, a prescribed fifth potential is applied to the control gate of the memory cell whose data is read out, and a prescribed sixth potential higher than the prescribed fifth potential is applied to the selecting transistor and memory cell whose data is not read out, whereby charges in the floating gate of the selected memory cell is transferred to the source-drain region of the non-selected memory cell.

In each operation mode, application of prescribed potentials to the gates and source-drain regions of memory cells and selecting transistor facilitates operation in erasure, writing and reading operation modes. This simplifies a method of operation in an EEPROM which can be highly integrated and consumes little electric power.

In another aspect of the present invention, a method of manufacturing an EEPROM includes the steps of: forming first and second multi-layered structures each including an insulating layer and a conductive layer formed a distance apart from each other on the main surface of a semiconductor substrate of a first conductivity type having the main surface; the first and second multi-layered structures including a first insulating layer formed on the main surface of the semiconductor substrate, a first conductive layer formed on the first insulating layer, a second insulating layer formed on the first conductive layer, and a second conductive layer formed on the second insulating layer; forming a third conductive layer at least between the first and second multi-layered structures and on the main surface of the semiconductor substrate; and forming an impurity region of a second conductivity type different from the first conductivity type in the region of the first and second multi-layered structures in which the third conductive layer is not formed and on the main surface of the semiconductor substrate.

The first and second multi-layered structures to be memory cells are formed a distance apart from each other on the main surface of the semiconductor substrate, and the third conductive layer to be a selecting transistor is formed between the multi-layered structures. These steps facilitate a method of its manufacture in an EEPROM which can readily be highly integrated and requires little power.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (1) First Embodiment

Now, one embodiment of the present invention will be described in conjunction with the drawings.

Figures 1A, 1B:
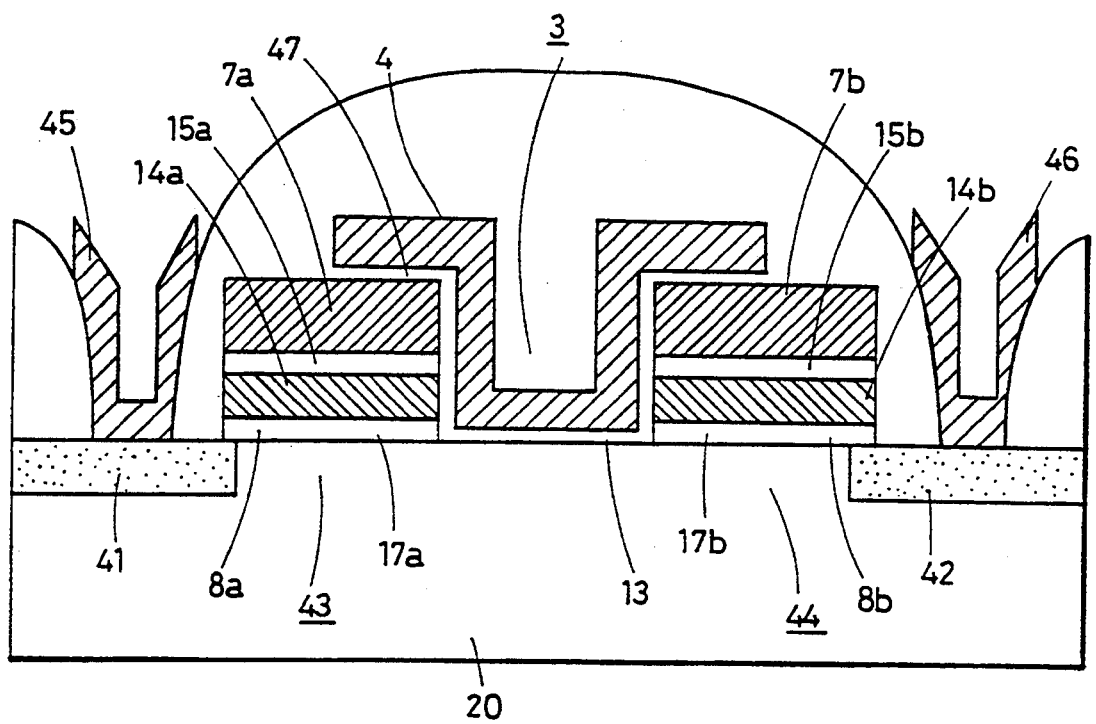
FIGS. 1A–1B are sectional views showing an EEPROM and applied voltage to each element of the EEPROM in accordance with a first embodiment of the present invention.
Figure 2:
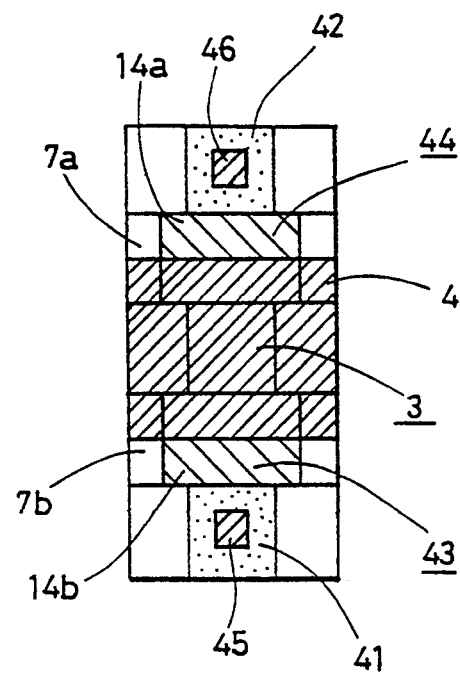
FIG. 2 is a top plan view showing one memory cell group of an EEPROM in accordance with the first embodiment of the present invention.
Figure 3:
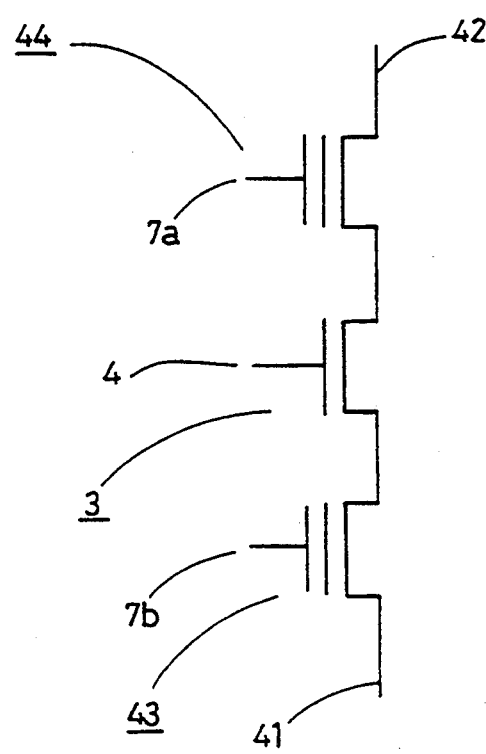
FIG. 3 is a circuit diagram showing one memory cell group.

Referring to FIGS. 1A and 1B, an EEPROM in accordance with the present invention includes a first source/drain diffusion layer 41 formed on a P type silicon substrate 20, a second source/drain diffusion layer 42 formed on P type silicon substrate 20 opposing to first source/drain diffusion layer 41, a first memory transistor 43 adjacent to first source/drain diffusion layer 41 and formed of a first gate silicon oxide film 17a, a floating gate 14a, an interlayer silicon oxide film 15a and a control gate 7a, a second memory transistor 44 adjacent to second source/drain diffusion layers 42 and formed of a first gate silicon oxide film 17b, a floating gate 14b, an interlayer silicon oxide film 15b and a control gate 7b, and a selecting gate 4 formed on the main surface of P type silicon substrate 20 and between first memory transistor 43 and second memory transistor 44. A first source/drain contact 45 is provided on first source/drain diffusion layer 41 for connection with a bit line, and a second source/drain contact 46 is provided on second source/drain diffusion layer 42 connection with a bit line. A second interlayer insulating film 47 is provided for insulation between the selecting gate electrode 4 of selecting transistor 3, and the respective control gates 7a, 7b and floating gates 14a, 14b of first and second memory transistors 43 and 44.

Figure 4:
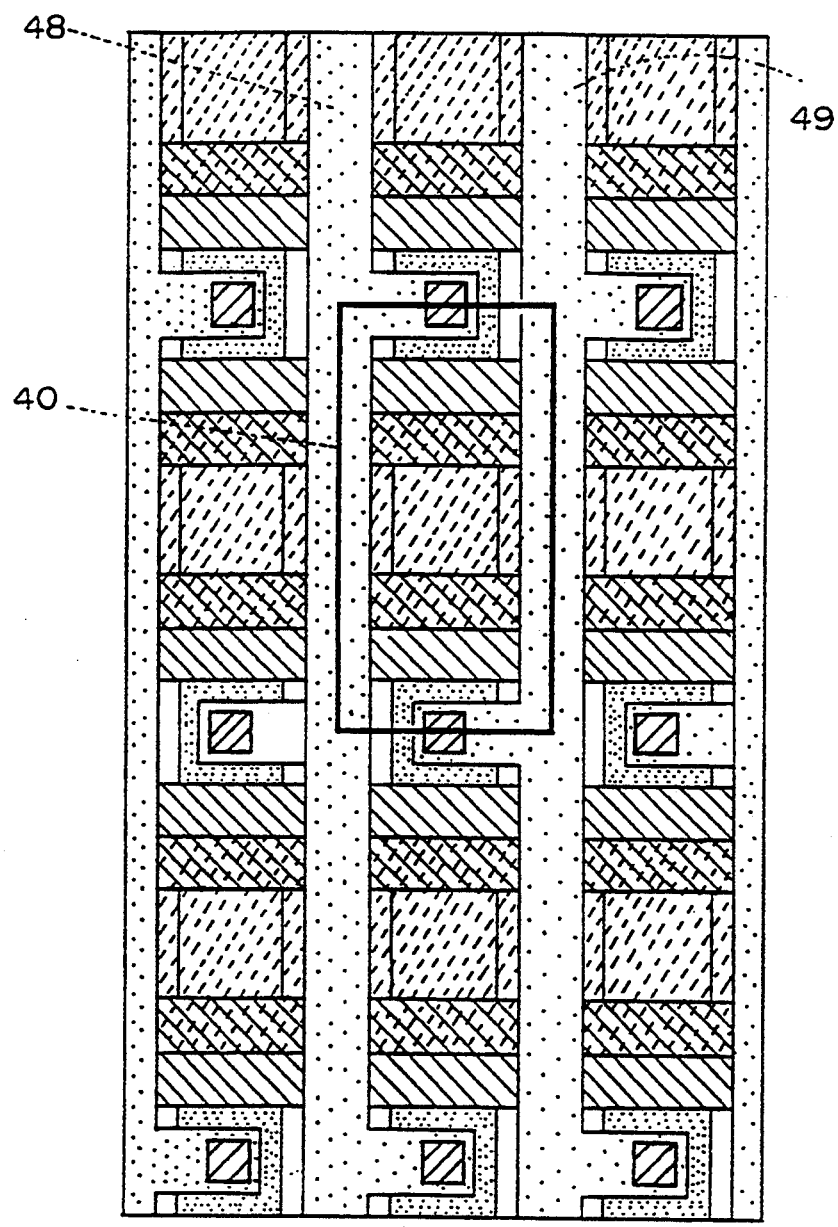
FIG. 4 is a top plan view showing a memory cell array formed of a plurality of memory cell groups.

Referring to FIGS. 1A, 1B and 4, first memory transistors 43, second memory transistor 44, first source/drain diffusion layer 41, second source/drain diffusion layer 42, and selecting transistor 3 between first and second memory transistors 43 and 44 constitute a memory cell group 40. In order to transfer potential signals from first source/drain contact 45 and second source/drain contact 46 onto the peripheral circuitry, first and second bit lines 48 and 49 are provided, respectively.

According to the invention, selecting transistor 3 is disposed between first memory transistor 43 and second memory transistor 44, and a channel formed by selecting transistor 3 formed underneath selecting gate silicon oxide film 13 connects first memory transistor 43 and second memory transistor 44. The opposing ends of selecting gate electrode 4 of select transistor 3 extend on the control gates 7a and 7b of first and second memory transistors 43 and 44 with second interlayer insulating film 47 therebetween. The first gate silicon oxide films 17a and 17b of first and second memory transistors 43 and 44 are formed as thin as about 100 Å. The floating gates 14a and 14b of first and second memory transistors 43 and 44 overlap first source/drain diffusion layer 41 and second source/diffusion layer 42, respectively by about a length between 0.1 and 0.2 μm with first gate silicon oxide films 17a and 17b therebetween. Tunnel regions 8a and 8b in the overlapped regions of floating gates 14a and 14b and first source/drain diffusion layer 41 and second source/drain diffusion layer 42 with first gate silicon oxide films 17a and 17b therebetween are formed in first memory transistor 43 and second memory transistor 44, respectively. First memory transistor 43 includes first source/drain diffusion layer 41, stacked electrodes 14a, 15a, and a virtual source/drain region formed under selecting guide 4. A Second source/drain layer 42 is functionally extended through an inversion channel under second memory transistor 44 and the selecting gate 4 of select transistor 3 as shown at 42a in FIG. 1A when the latter transistors are made conductive, effectively extending the second source/drain to a position under selecting gate 4. Thus, the region under selecting gates 4 functions as a virtual source/drain region to first memory transistor 43.

Conversely, second memory transistor 44 includes second source/drain layer 42, stacked electrodes 7b and 15b and a virtual drain/source region formed under selecting gates 4. Selecting transistor 3 includes selecting gate 4 and virtual source/drain regions formed in channel regions beneath stacked electrodes 7a, 15a and 7b, 15b, when memory transistors 42 and 43 are made conductive.

Now, referring to FIGS. 1A and 1B, the operation of an EEPROM in accordance with the present invention will be described. As for erasure of data, a voltage for writing of about 20 V is applied to the control gate 7a of first memory transistor 43. First source/drain diffusion layer 41 is grounded at that time, and a high electric field of about 13 MV/cm is generated in tunnel region 8a. Electrons are injected from first source/drain diffusion layer 41 grounded to floating gate 14a by Fowler-Nordheim (F-N) tunnel current, thereby rendering first memory transistor 43 in the state of enhancement. In this case, optimization of the capacitive coupling ratio or voltage for writing of memory transistor 6a causes the threshold voltage (Vth) of the memory transistor after the erasure to be between about 2 and 3 V. As for second memory transistor 44, erasure is conducted in a similar manner using second source/drain diffusion layer 42 instead of first source/drain diffusion layer 41.

In writing of data, the control gate 7a of first memory transistor 43 is grounded, and a voltage for erasure of about 20 V is applied to first source/drain diffusion layer 41. Electrons are drawn out from floating gate 14a to first source/drain diffusion layer 41. Drawing electrons out from the floating gate 14a of memory transistor 43 enables the threshold voltage of memory transistors 43 to be −3 V and less, creating a depletion state. As for second memory transistor 44, a similar writing operation is conducted using second source/drain diffusion layer 42 in place of first source/drain diffusion layer 41.

Reading of data is conducted by a whole memory cell group 40 formed by first and second memory transistors 43 and 44, first source/drain diffusion layer 41, second source/drain diffusion layer 42 and selecting transistor interposed between first and second memory transistors 43 and 44. More specifically, a potential about 5 V higher than the threshold value of selecting transistor 3 (about 0.5 V) is applied to the selecting gate electrode 4 of selecting transistor 3 at the time of reading the state of first memory transistor 43, thus turning on the channel of selecting transistor 3. Also, a gate voltage about 5 V higher than the threshold voltage of second memory transistor 44 at the time of erasure is applied to the control gate 7b of non-selected second memory transistor 44 belonging to the same memory cell group as the selected first memory transistor 43. As a result, the floating gate 14b of second memory transistor 44 has its channel turned on regardless of the state of electron storage in floating gate 14b. The control gate 7a of the selected first memory transistor 43 is grounded. The channel of first memory transistor 43 is not turned on when first memory transistor 43 is in the state of erasure, in other words in the state of enhancement, by grounding the control gate 7a of first memory transistor 43. Also, when the data is being written in first memory transistor 43, the channel of first memory transistor 43 is turned on even if the control gate 7a is grounded, because the channel of first memory transistor 43 is in the state of depletion at that time. In this state, a potential of about 1 V is applied to first source/drain diffusion layer from first bit line 43 through first source/drain contact 45, and a ground potential is applied to second source/drain diffusion layer 42 from second bit line 49 through second source/drain contact 46. The state of first memory transistor 43 is determined by the presence or absence of current through first bit line 48 and second bit line 49. In other words, if current flows from first bit line 48 to second bit line 49, first memory transistor 43 in the state of depletion, if not in the state of enhancement.

Figure 5:
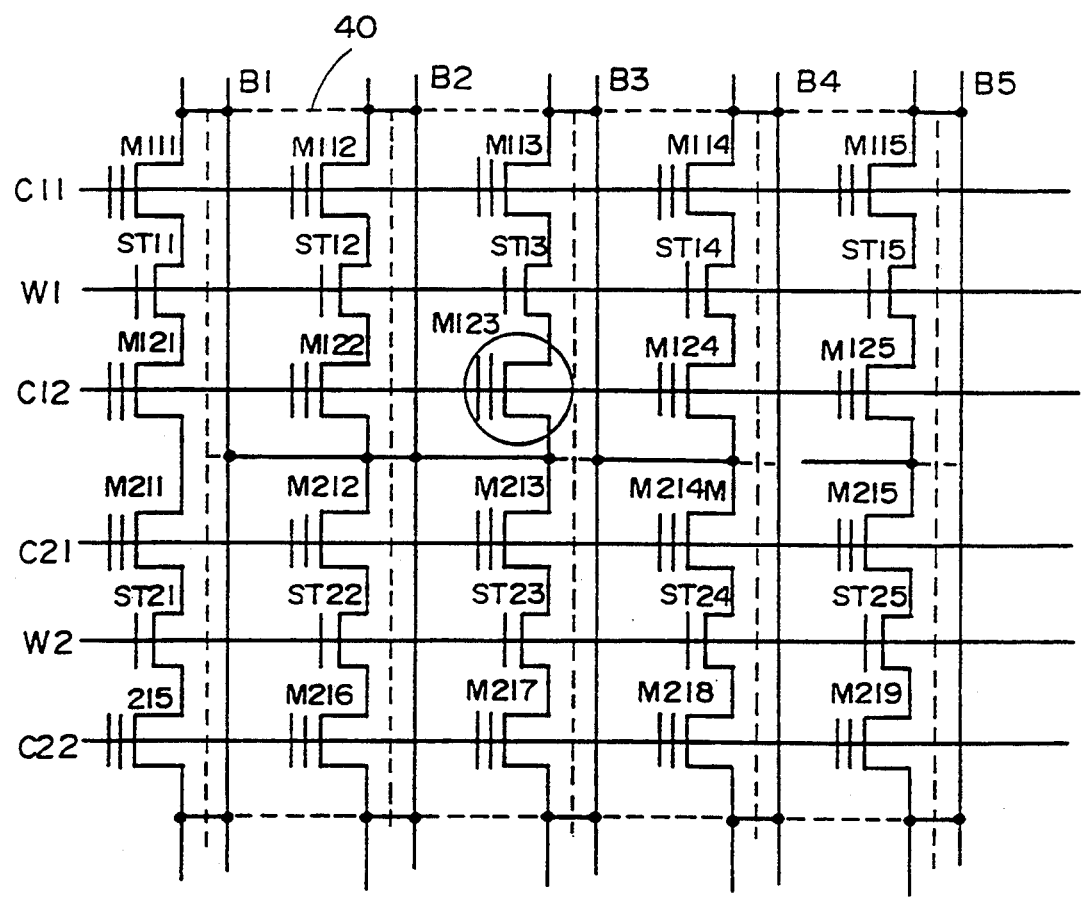
FIG. 5 is a circuit diagram showing a memory cell array.

The operation of memory cell group 40 has been described in the foregoing, and a certain interference measures is needed in the operation between a selected memory cell group 40 and a non-selected memory cell group 40 in the operation of this cell. More specifically, measures is required, for preventing erroneous writing or erasure from taking place in the non-selected memory cell groups 40 when erasure or writing of data is conducted from and to the selected memory cell group 40 in a memory cell array formed of a plurality of memory cell groups 40. FIG. 4 is a top plan view showing such a memory cell array, FIG. 5 showing the circuit layout of the memory cell array. The region surrounded by the dotted line in FIG. 5 corresponds to a memory cell group 40. Memory transistors M111, M112 . . . are connected to bit lines B1, B2 . . . , and control gate lines C11, C12 . . . , and selecting transistors ST11, ST12 . . . are connected to word lines W1, W2 . . . , respectively.

Now, the operation in a memory cell array will be described in conjunction with FIGS. 5 to 8.

Figure 6:
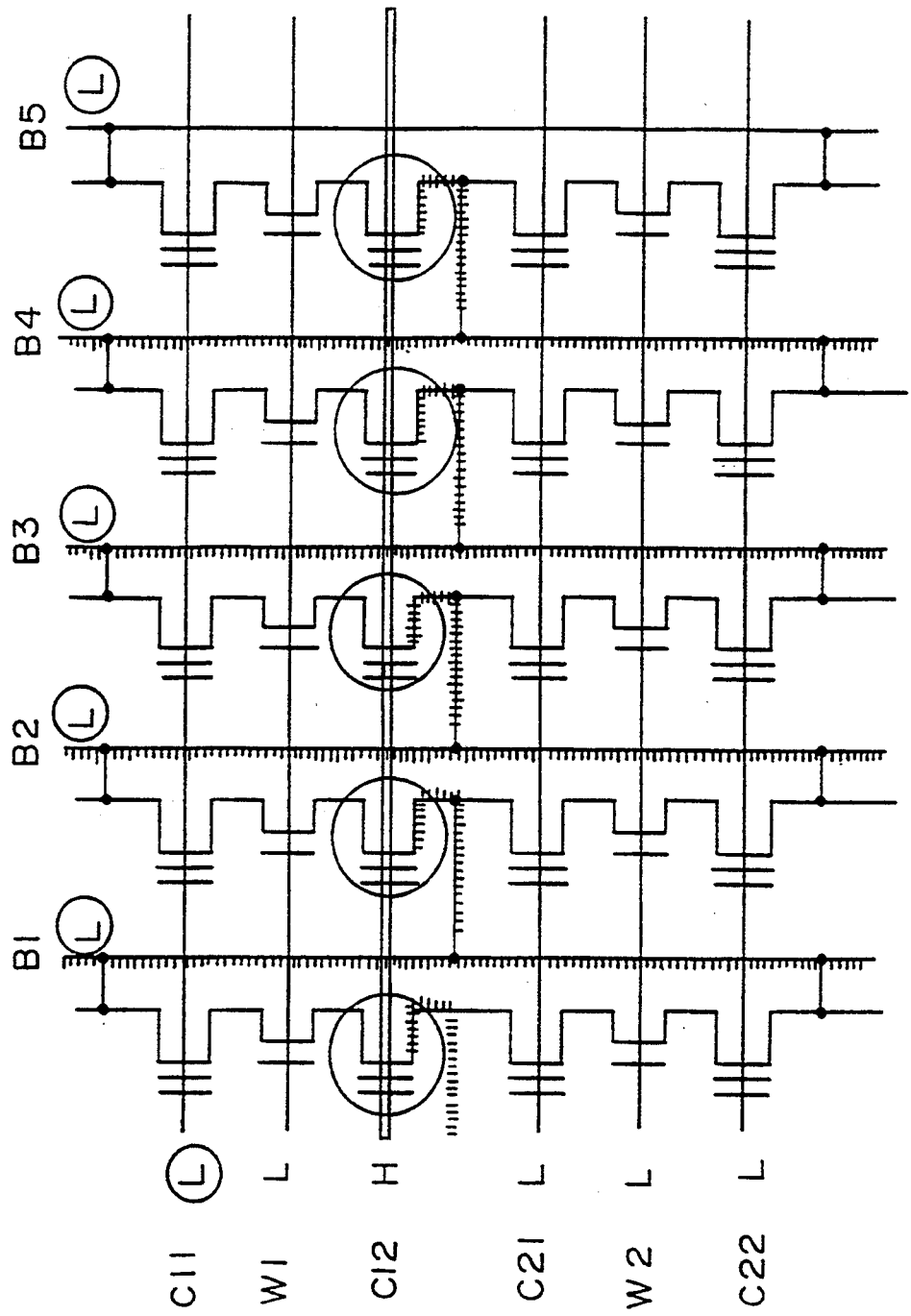
FIG. 6 is a diagram showing the potentials of lines upon erasure.

Erasure is conducted on 1 byte=8 bit basis, which is a basic unit of information. A high voltage "H" of about 20 V is applied only to a selected control gate line C12 so that erasure of information from memory transistors M121, M122, M123, M124, M125 is conducted without interfering the other non-selected memory transistors. If only M123 indicated by the circle is desired to be erased, bit line B2 is pulled to ground potential L with the other conditions being the same, and an intermediate potential "M" of about 7 V is applied to the other bit lines B1, B3, B4, thereby permitting selective erasure of information. The potential states of bit lines B1-B5, control gate lines C11 to C22, and word lines W1, W2 are shown in FIG. 6, when information of the memory transistor column M125 to M125 sharing control gate line C12 are erased.

Writing is conducted selectively only into the selected bit M123. A high voltage "H" of about 20 V is applied only to bit line B2 and the other bit lines are maintained at the ground potential "L". With only control gate line C12 including the control gates 7 of memory transistor 123 to which writing is conducted being kept at the ground potential "L", the other control gate lines are all maintained at an intermediate potential "M"

of about 7 V. Word lines W1, W2 to be selecting gate are kept at the ground potential "L".

Figure 7:
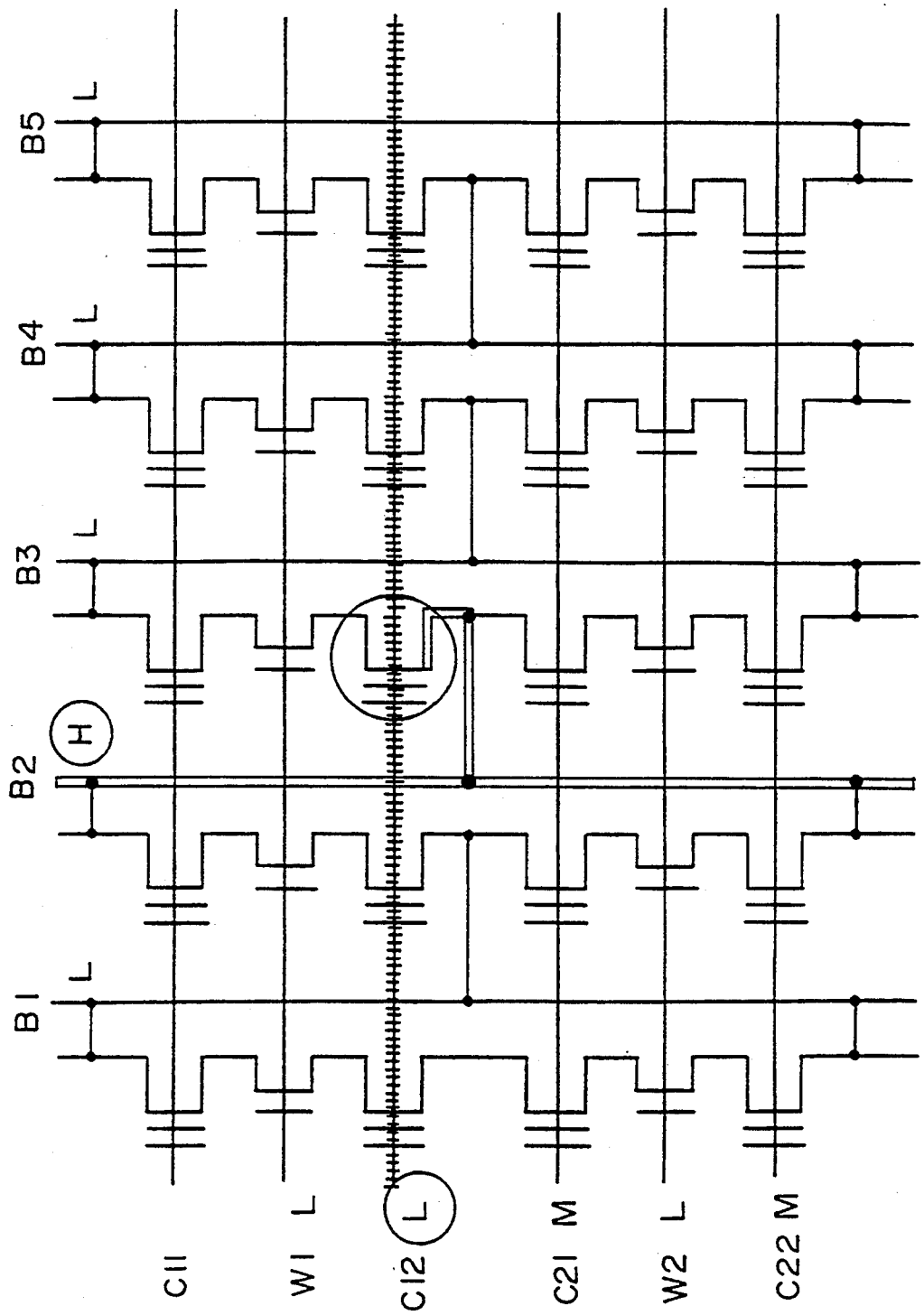
FIG. 7 is a diagram showing the potential of lines upon writing.

The potentials of bit lines B1 to B5, control gate line C11 to C22, and word lines W1, W2 in this state are shown in FIG. 7.

Figure 8:
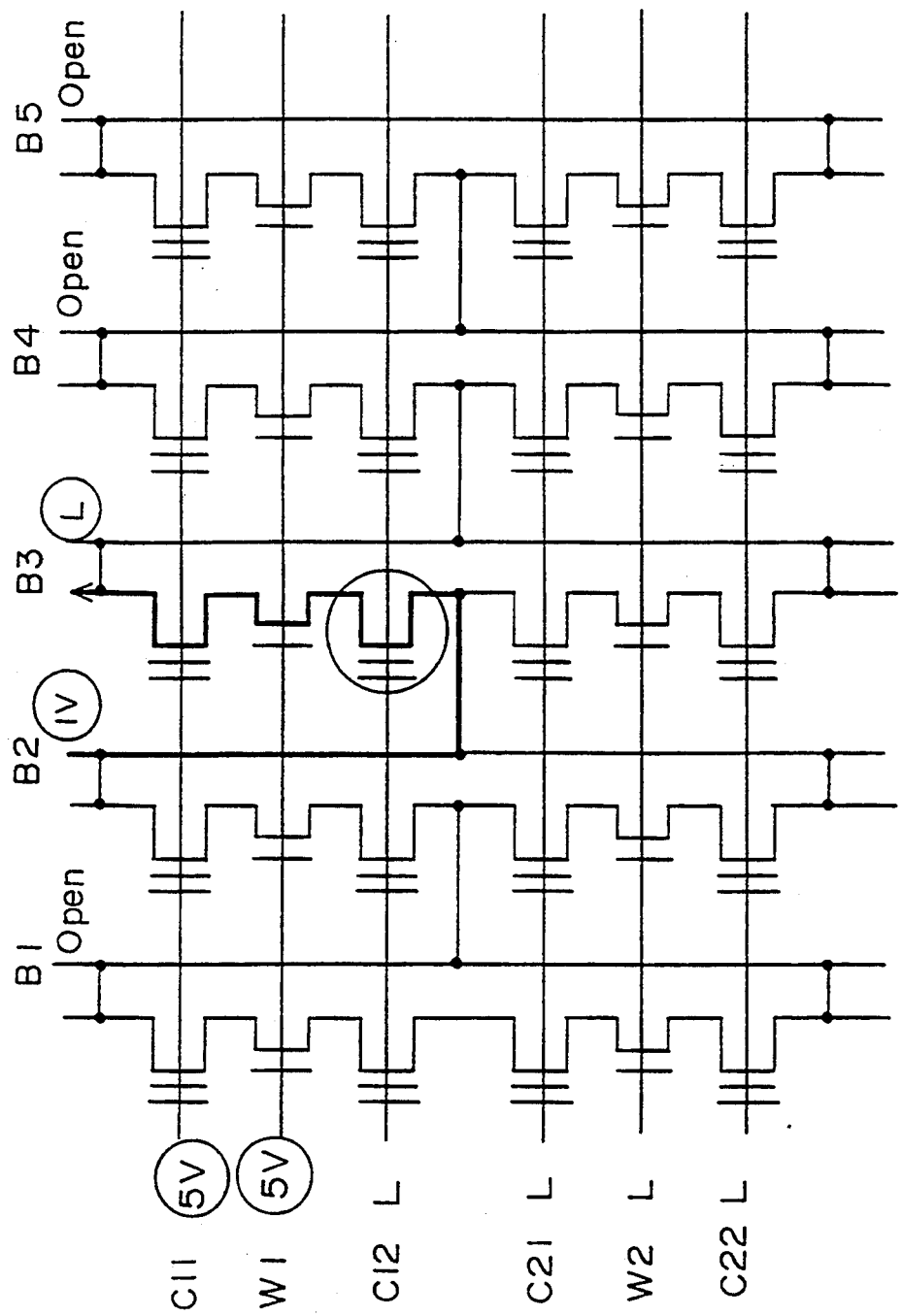
FIG. 8 is a diagram showing the potentials of lines upon reading.

Description will be provided on reading operation. Reading is conducted by applying a voltage of 5 V to control gate line C11 including the control gate 7 of the non-select memory transistor among a selected memory cell group 40. A potential of 5 V is applied to word line W1 including the selecting gate electrode 4 of the selected memory cell group 40, and control gate line C12 including the control gate 7 of memory transistor M123 is maintained at the ground potential "L". A potential for reading of 1 V is applied to bit line B2 connected to source/drain diffusion layer adjacent to the selected memory transistor M123. The ground potential "L" is applied to bit line B3 connected to the source/drain diffusion layer adjacent to the non-selected memory transistor among the selected memory cell group. The other non-selected bit lines B1, B3, B4 are kept at the state of floating, and do not constitute any current path. The ground potential "L" is applied to non-selected word line W2 and non-selected control gate lines C12 and C22. At that time, if the selected memory transistor M123 is in the state of erasure, current does not flow! from bit line B2 to bit line B3, but if the data is written, current does flow from bit line B2 to bit line B3. The reading current is determined as information representing "0" or "1" in the sense amplifier of the peripheral circuitry. Control of reading is thus conducted. The potentials of bit lines B1 to B5, control gate lines C11 to C22, and word lines W1, W2 in this case are shown in FIG. 8.

Figure 9A:
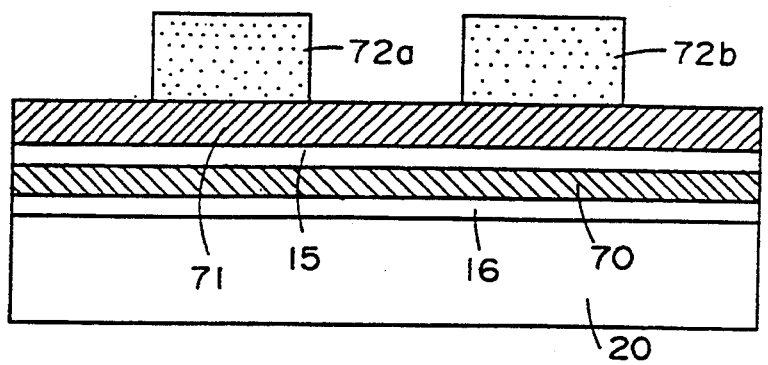
FIGS. 9(A)–9(C) are views showing a method of manufacturing an EEPROM in accordance with the first embodiment of the present invention.
Figure 9B:
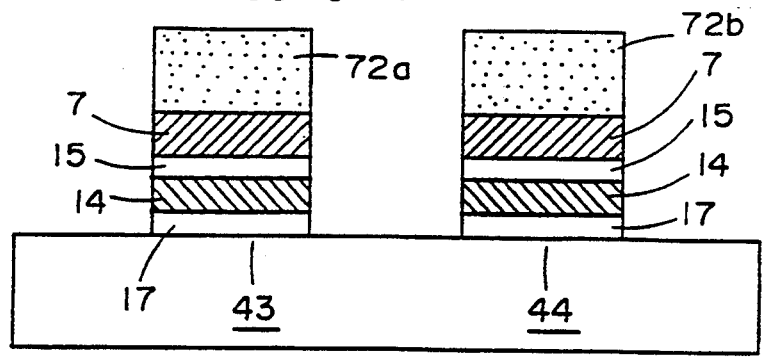
Figure 9C:
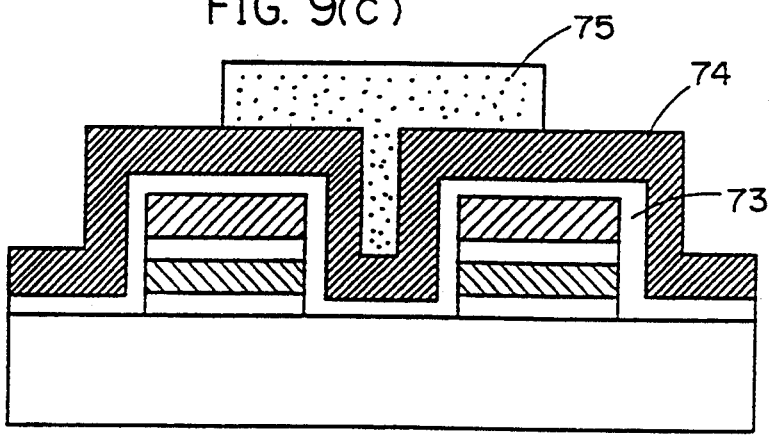
Figure 10A:
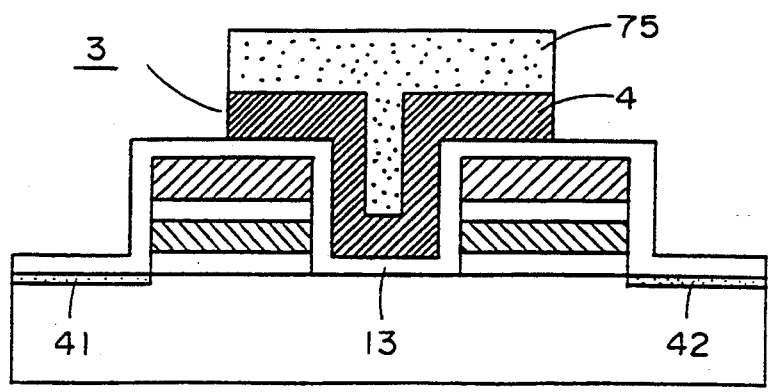
FIGS. 10(A) and 10(B) are diagrams showing a method of manufacturing an EEPROM in accordance with the first embodiment of the present invention.
Figure 10B:
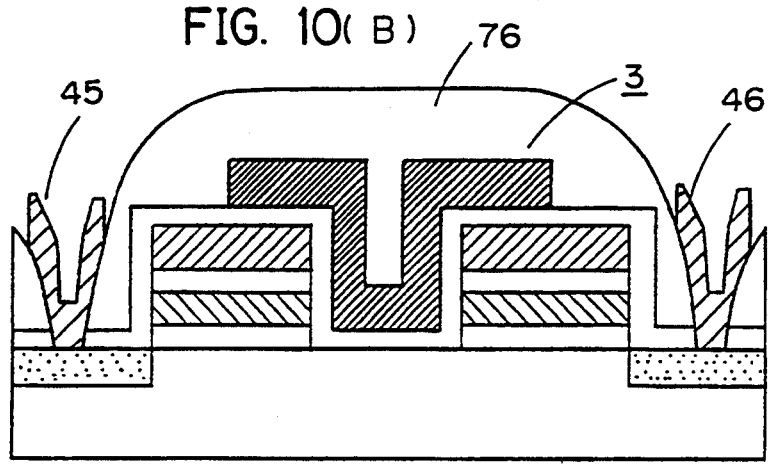

Now, description will be provided on a method of manufacturing an EEPROM in accordance with the present invention. FIGS. 9 and 10 are views showing a method of manufacturing an EEPROM in accordance with the present invention on a step by step basis.

Referring to FIG. 9 (A), insulating film 16 is formed on P type silicon substrate 20, polysilicon layer 70 is formed on insulating film 16, interlayer silicon oxide film 15 is formed on polysilicon layer 70, and polysilicon layer 71 is formed on interlayer silicon oxide film 15. Resists 7a and 7b are formed in prescribed regions on polysilicon layer 71.

Referring to FIG. 9 (B), etching is conducted, forming first memory transistor 43 and second memory transistor 44.

After removal of resists 72a and 72b, entire oxidation is conducted, forming an oxide film 73 covering the main surfaces of first memory transistors 43, second memory transistor 44 and P type silicon substrate 20. A polysilicon layer 74 is deposited on oxide films 73, and resist 75 is applied to a prescribed region of polysilicon layer 74 as shown in FIG. 9 (C).

Etching is conducted in the state shown in FIG. 9 (C), and selecting gate 4 to be the gate of selected gate transistors 3 as shown in FIG. 10 (A) is formed. At that time, an n type impurity layer to be first and second source/drain diffusion layers are formed, for example, by means of ion-implantation in the parts of P type silicon substrate 20 in which first and second memory transistors 43 and 44 are not formed.

After removal of resist 75, contact holes are formed in an insulating film formed on first and second source/drain diffusion layers 41 and 42, for example, by means of etching. First and second source/drain contacts 45 and 46 are formed through these contact holes. An interlayer insulating film 76 covering first and second memory transistors 43 and 44 and select gate 4 is formed. As a result, an EEPROM as shown in FIG. 10 (B) is provided.

(2) Second Embodiment

Figure 11:
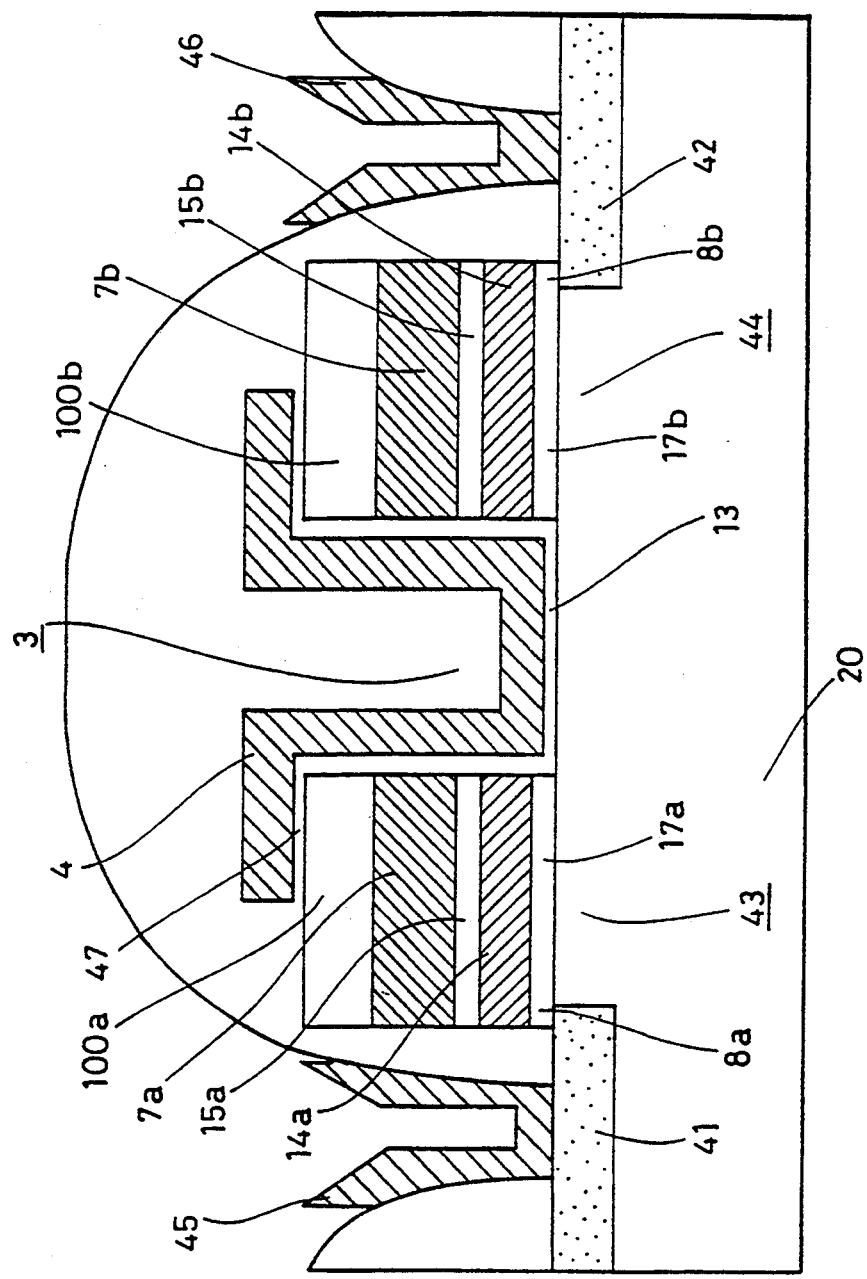
FIG. 11 is a cross sectional view showing an EEPROM in accordance with a second embodiment of the present invention.

FIG. 11 is a cross sectional view showing an EEPROM in accordance with a second embodiment of the invention. The basic construction of the second embodiment is the same as the first embodiment, only portions different from the first embodiment will be described in the following.

Referring to FIG. 11, in the EEPROM in accordance with the second embodiment, provided on control gates 7a, 7b are upper interlayer insulating films 100a, 100b, respectively formed in a self-aligned manner to control gates 7a, 7b. The thicknesses of upper interlayer insulating films 100a and 100b are equal to or thicker than the thicknesses of control gates 7a and 7b. In an operation of the memory cell shown in FIGS. 5 to 8, an electric field of about 10 V is generated between the control gates 7a and 7b of memory transistors 43 and 44 and the selecting gate 4 of selecting transistor 3. The electric field has its field intensity relaxed by thick insulating films 100a and 100b, thus preventing deterioration and erroneous operation caused by breakdown.

As described above, in the second embodiment, the insulating film between the pair of memory transistors and the selecting transistor is formed thick, insulation between the pair of memory transistors and the select transistor is improved, and, therefore, an EEPROM highly reliable and allowing high density integration with a reduced power consumption is provided.

(3) Third Embodiment

Figure 12:
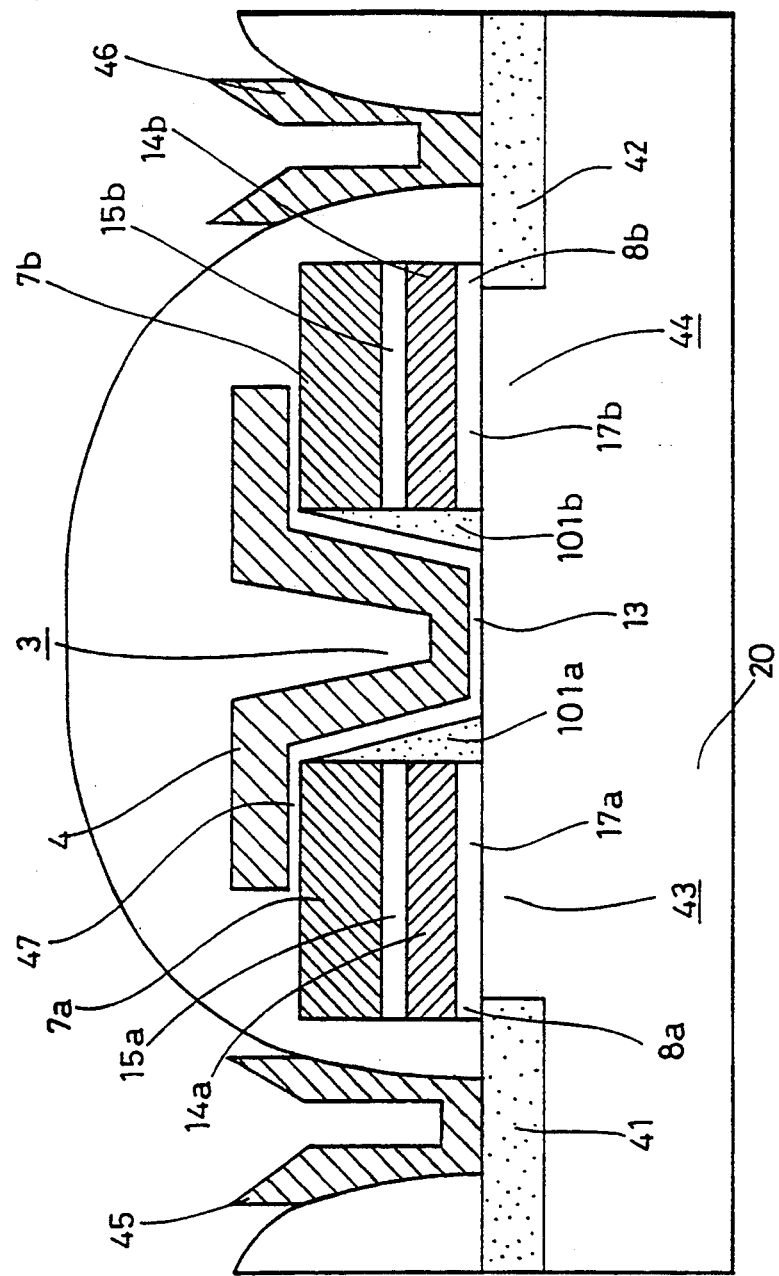
FIG. 12 is a cross sectional view showing an EEPROM in accordance with a third embodiment of the present invention.

FIG. 12 is a cross sectional view showing an EEPROM in accordance with a third embodiment of the present invention. Referring to FIG. 12, memory transistor sidewall insulating films 101a, 101b are provided, for insulation between respective floating gates 14a, 14b and control gates 7a, 7b, of first and second memory transistors 43 and 44 and selecting gate electrode 4 of selecting transistor 3 in the EEPROM.

In the third embodiment, an electric field of about 10 V generated between the control gates and floating gates of the memory transistors and the selecting gates of the selecting transistor has its intensity relaxed by the memory transistor sidewall insulating films, so that deterioration and erroneous operation caused by breakdown, etc. can be prevented.

(4) Fourth Embodiment

Figure 13:
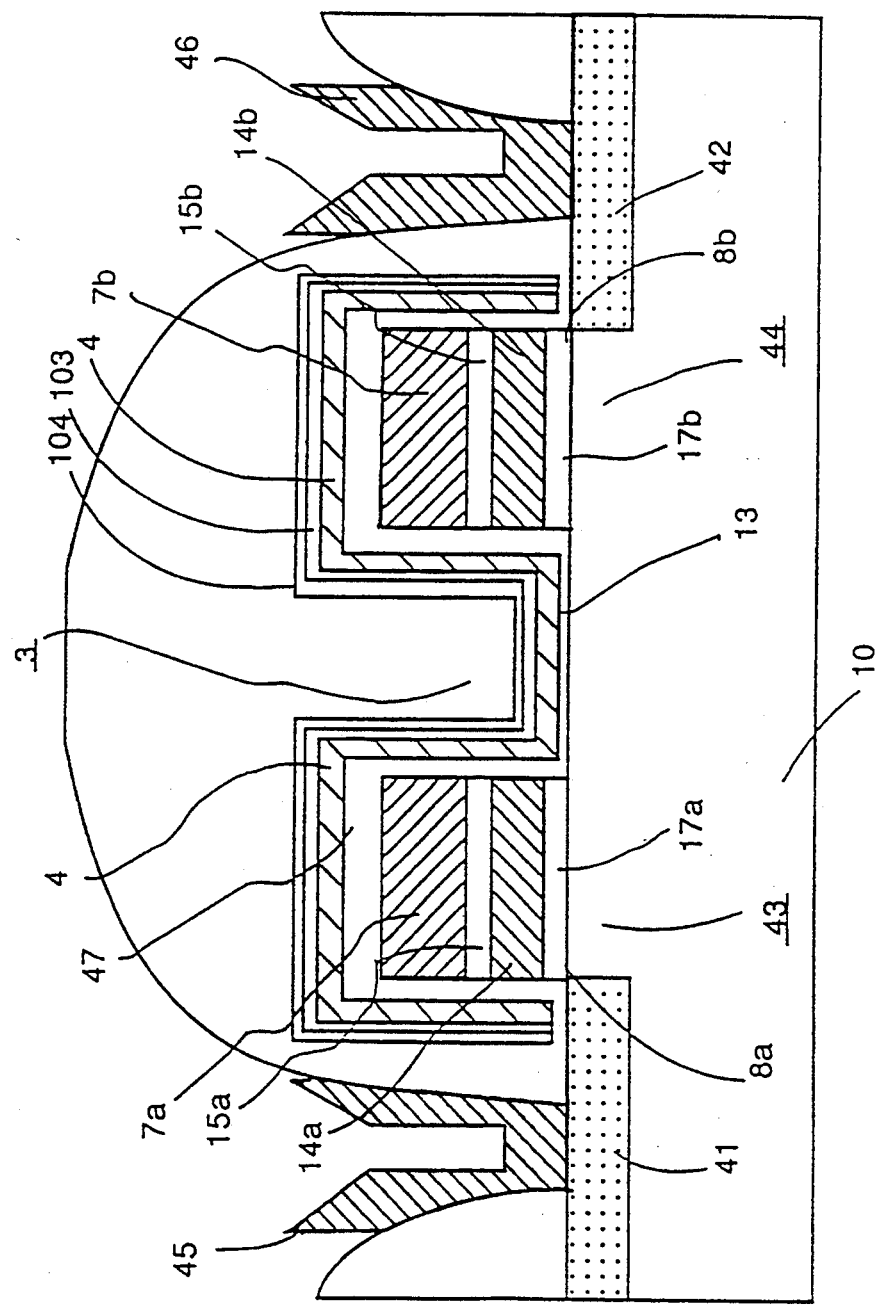
FIG. 13 is a cross sectional view showing an EEPROM in accordance with a fourth embodiment of the present invention.

FIG. 13 is a cross sectional view showing an EEPROM in accordance with a fourth embodiment of the present invention. Referring to FIG. 13, in the fourth embodiment of the present invention, the selecting gate electrode 4 of selecting transistor 3 covers respective memory transistors 43, 44 and extends over first and second source/drain diffusion layers 41 and 42.

Selecting gate electrode 4 generally requires a thickness larger than 20 nm for avoiding damages to be given to select gate oxide film 13 in the manufacture. However, since selecting gate electrode 4 extends over the control gates 7a and 7b of memory transistors 43 and 44, the step difference in the memory cell is increased with the thickness more than 20 nm resulting in difficulty in forming source/drain contacts or metal interconnection layers. In this embodiment, selecting gate electrode 4 is made as thin as about 10 nm and a selecting gate electrode upper oxide film 103 and a selecting gate electrode upper nitride film 104 are provided on selecting gate electrode 4 so that damages in the manufacture will not be given to selecting gate oxide film 13.

As described above, in the fourth embodiment, since the oxide film and the nitride film are provided on the gate electrode of the selecting transistor, which makes it possible to form selecting gate electrode 4 to be thin, a memory cell with small step difference highly suitable for manufacture results, and, therefore, an EEPROM highly reliable and allowing high density integration can be provided.

(5) Fifth Embodiment

Figure 14:
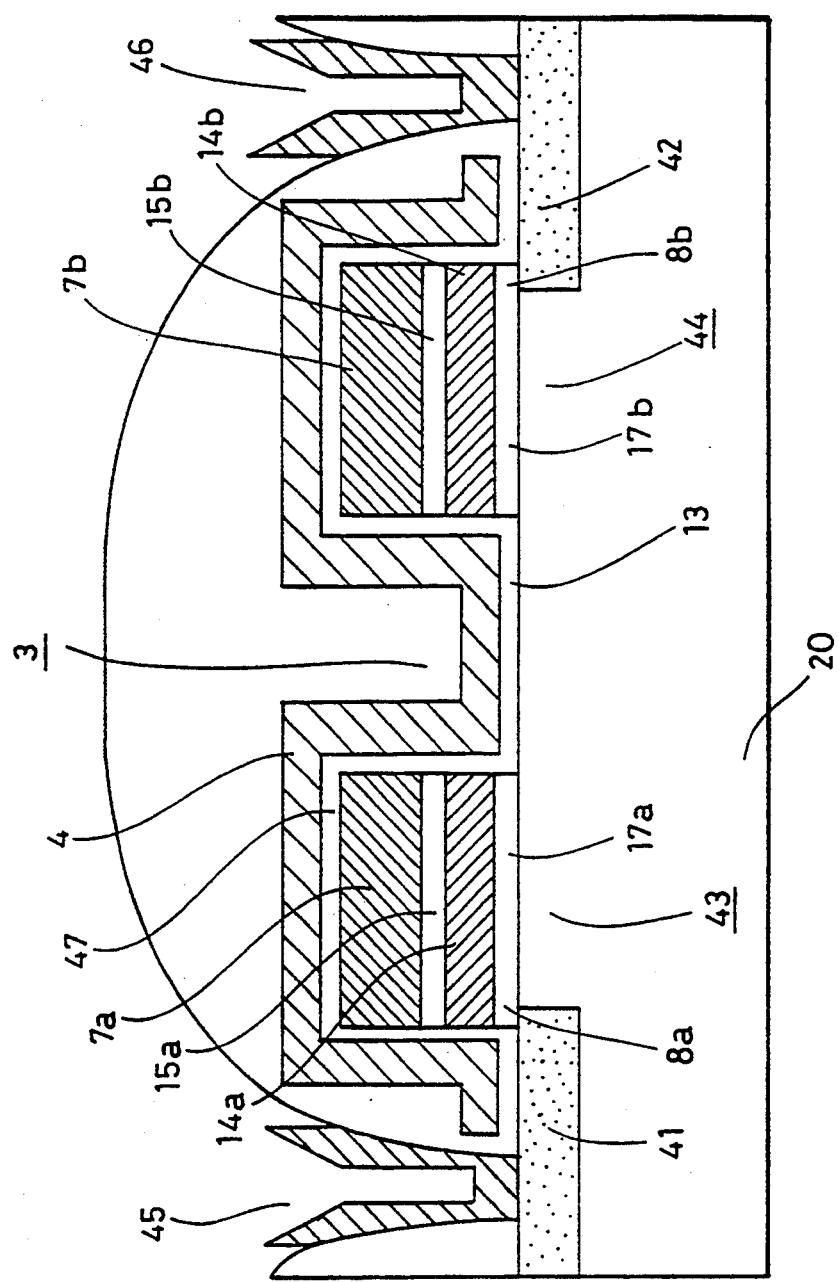
FIG. 14 is a cross sectional view showing an EEPROM in accordance with a fifth embodiment of the present invention.

FIG. 14 is a cross sectional view showing an EEPROM in accordance with a fifth embodiment of the present invention. Referring to FIG. 14, in the EEPROM in accordance with the fifth embodiment of the present invention, selecting gate electrode 4 completely covers the control gates 7a and 7b of memory transistors 43 and 44, and extends over first source/drain diffusion layer 41 and second source/drain diffusion layer 42.

A tunnel region 8a is formed between floating gate 14a and first source/drain diffusion layer 41 in memory transistor 43, while a tunnel region 8b is formed between floating gate 14b and second source/drain diffusion layer 42 in memory transistors 44. Tunnel regions 8a and 8b are likely to change in the characteristics due to a heat treatment after formation of memory transistors 43 and 44, but it is possible to suppress the changes in the characteristics by extending selecting gate electrode 4 to first source/drain diffusion layer 41 and second source/drain diffusion layer 42.

As described above, according to the EEPROM of the fifth embodiment, since the gate electrode of the select transistor extends to the source/drain diffusion layer of the memory transistor, the characteristic changes of the tunnel regions can be suppressed, so that an EEPROM having a stable characteristic, highly reliable and allowing high density integration can be provided.

(6) Sixth Embodiment

Figure 15:
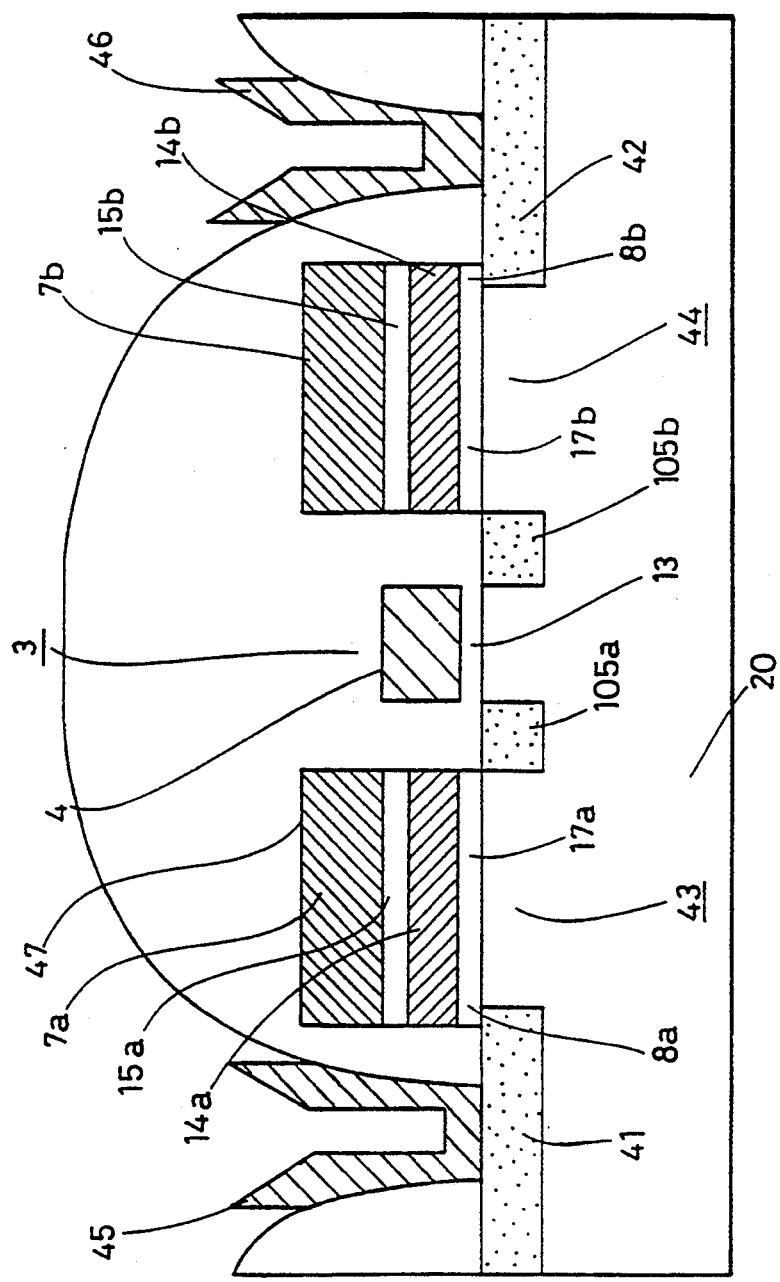
FIG. 15 is a cross sectional view showing an EEPROM in accordance with a sixth embodiment of the present invention.

FIG. 15 is a cross sectional view showing an EEPROM in accordance with a sixth embodiment of the present invention. Referring to FIG. 15, in the sixth embodiment of the present invention, selecting transistor 3 is formed of selecting gate oxide film 13, selecting gate electrode 4, a first connection diffusion layer 105a and a second connection diffusion layer 105b.

In the sixth embodiment, selecting gate electrode 4 does not extend over floating gates 14a, 14b, and selecting transistor 3 including first connection diffusion layer 105a and second connection diffusion layer 105b is completely fit into the space between memory transistors 43 and 44, thus reducing the step difference of the memory cells.

As described above, in the sixth embodiment, the select transistor is completely fit into the space between the two memory transistors, reducing the step difference of the memory cells, so that memory cells with reduced step portions suitable for manufacture can be provided, and an EEPROM highly reliable and allowing high density integration with a reduced power consumption can be provided.

(7) Seventh Embodiment

Figure 16:
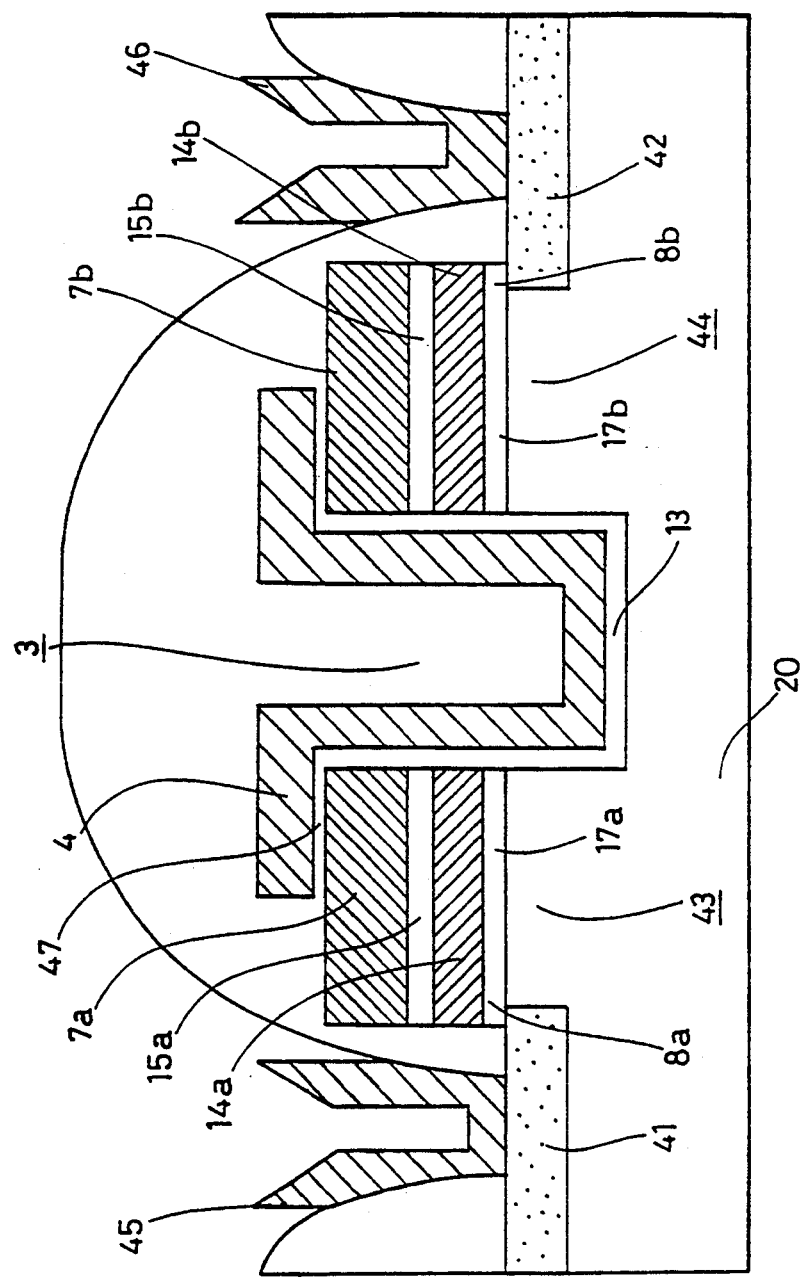
FIG. 16 is a cross sectional view showing an EEPROM in accordance with a seventh embodiment of the present invention.

FIG. 16 is a cross sectional view showing an EEPROM in accordance with a seventh embodiment of the present invention. Referring to FIG. 16, in the EEPROM in accordance with the seventh embodiment of the present invention, a silicon substrate 20 between a pair of adjacent memory transistors 43 and 44 is etched and trenched in a self-aligned manner to control gates 7a, 7b. Selecting gate oxide film 13 is formed in a surface of the trenched region of silicon substrate 20 so as to form the region to be the channel of the selecting transistor, and then selecting gate electrode 4 is formed. The length of the gate of the channel of selecting transistor 3 is constituted by the distance between adjacent memory transistors 43 and 44 plus twice the height of the trench of silicon substrate 20, and therefore, selecting transistor 3 less likely to be affected by a short channelling effect is provided.

As in the foregoing, in the seventh embodiment, since the channel region of the selecting transistor is formed in the trenched region of the substrate between the adjacent memory transistors, and the length of the gate of the selecting transistor can be increased without increasing the size of the memory cell, an EEPROM with reduced power consumption can be provided.

(8) Eight Embodiment

Figure 17:
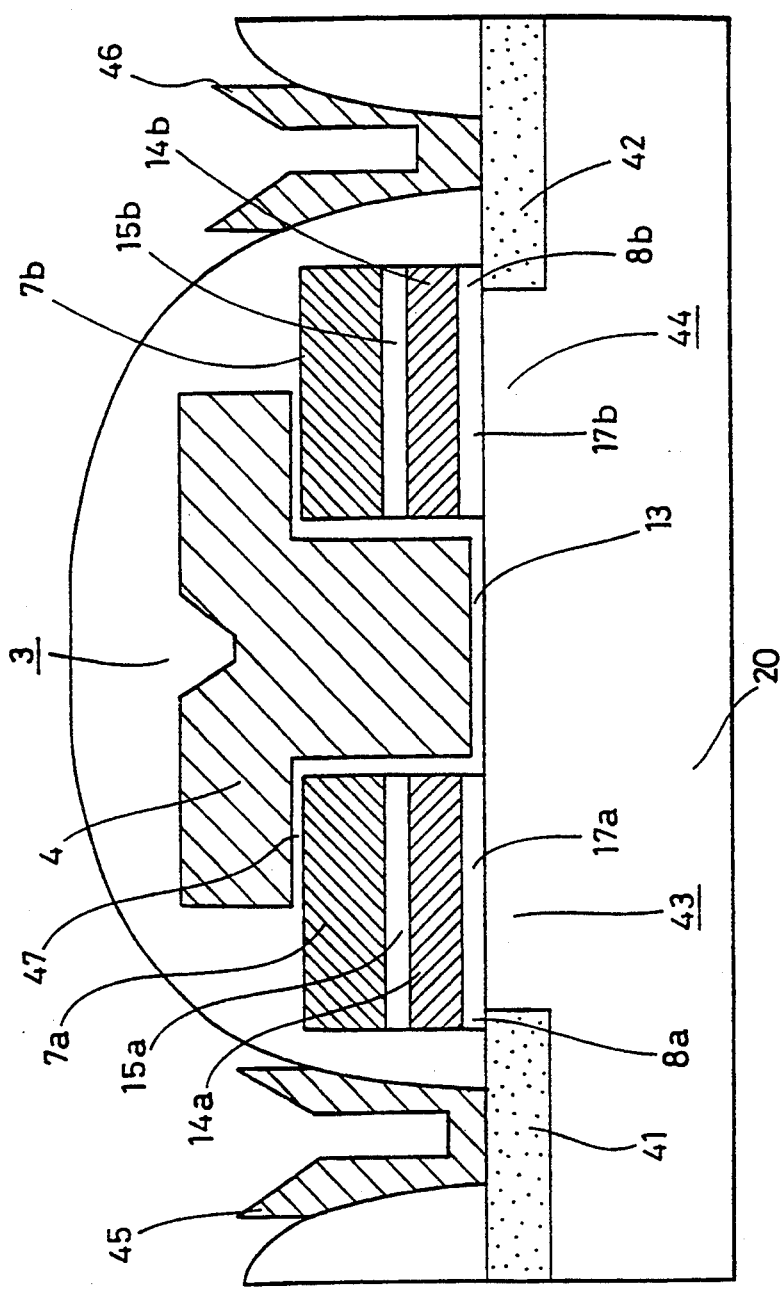
FIG. 17 is a cross sectional view showing an EEPROM in accordance with an eighth embodiment of the present invention.

FIG. 17 is cross sectional view showing an EEPROM in accordance with a seventh embodiment of the present invention. Referring to FIG. 17, in the EEPROM in accordance with the seventh embodiment, the thickness of the selecting gate electrode 4 of selecting transistor 3 is made ½ the distance between adjacent memory transistors 43 and 44. Thus, the recess of selecting gate electrode 4 is completely filled. By completely filling the recess of the selecting gate, the space between deposited films for insulation between layers produced in the recess can be eliminated.

Consequently, in the eighth embodiment, an EEPROM which can prevent degradation in reliability due to the gap between the deposited films caused by the recess can be provided.

(9) Ninth Embodiment

Figure 18:
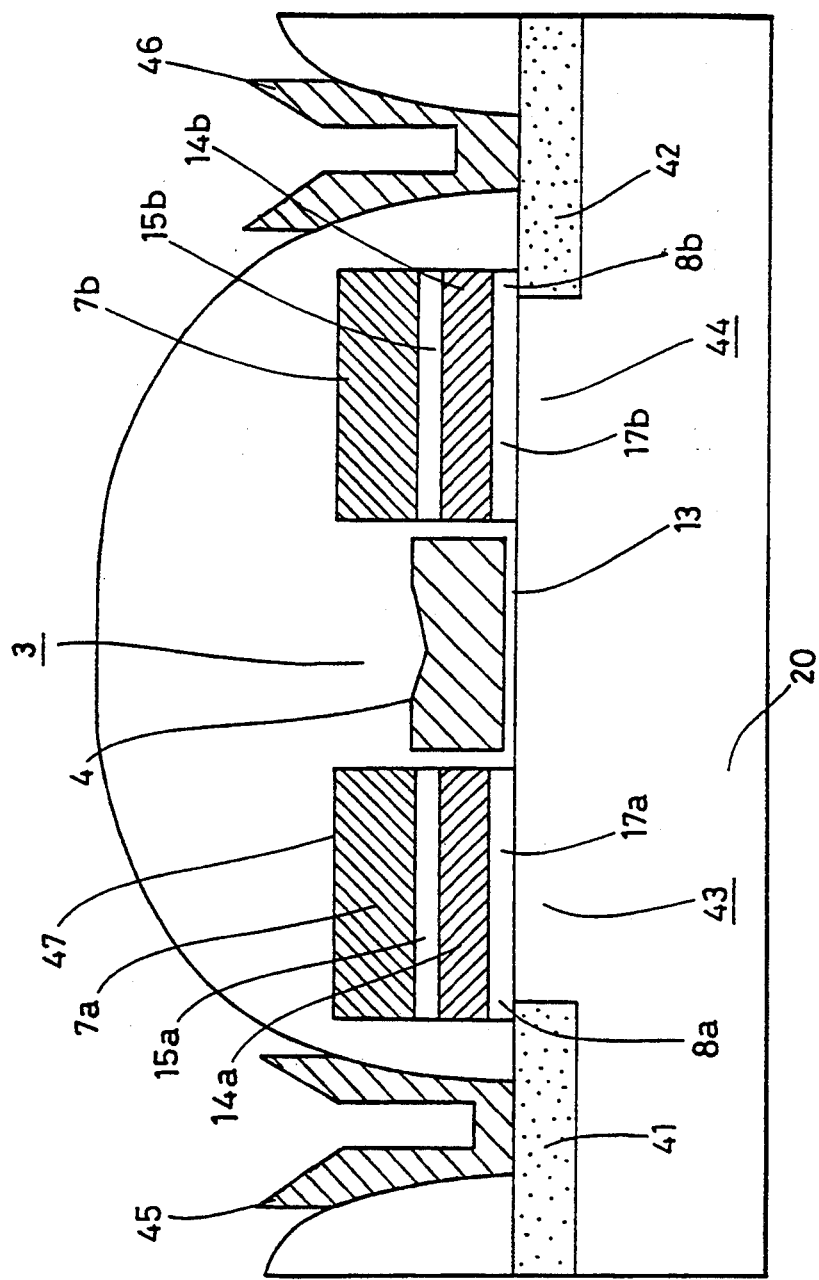
FIG. 18 is a cross sectional view showing an EEPROM in accordance with an ninth embodiment of the present invention.
Figure 19:
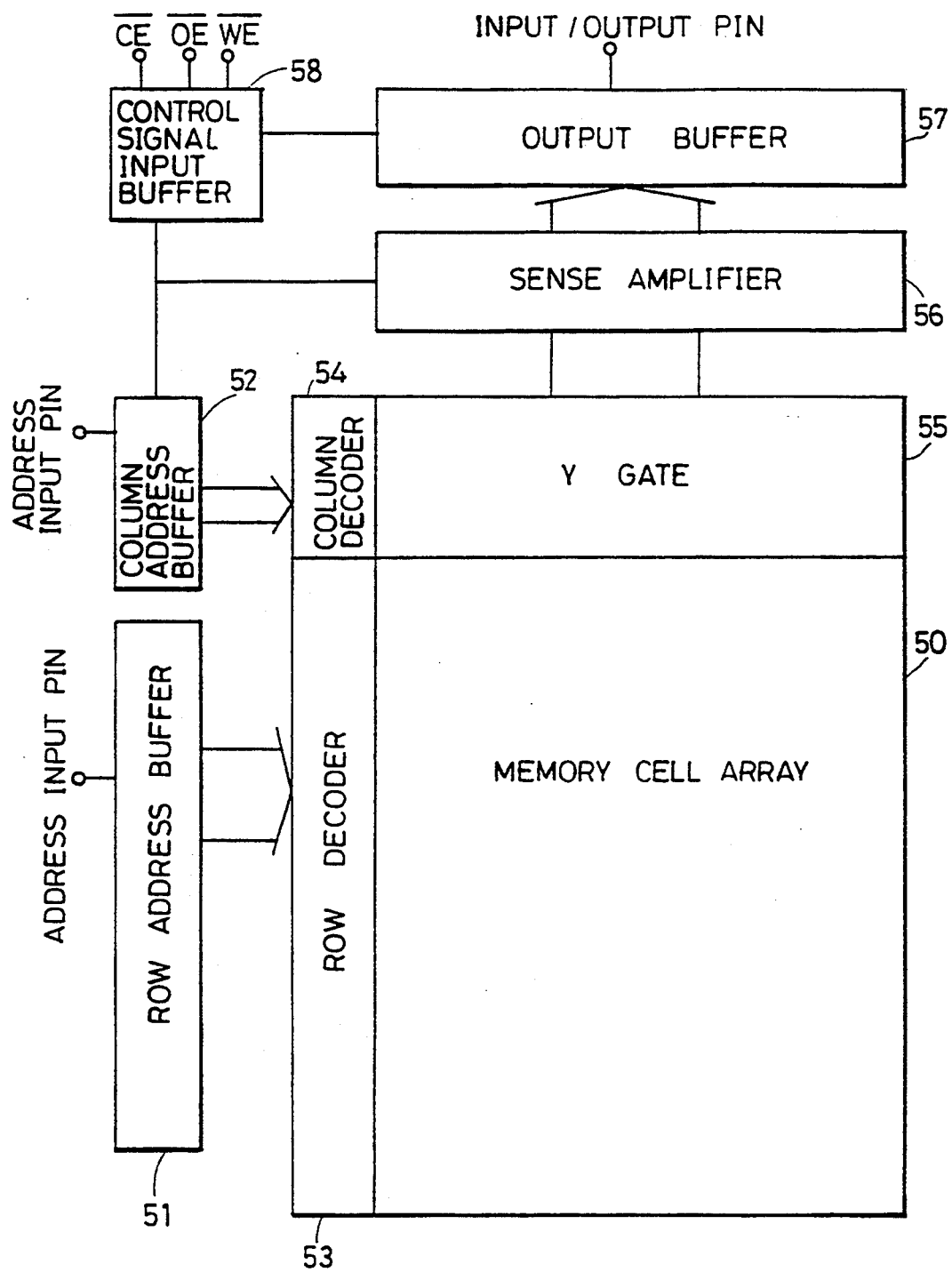
FIG. 19 is a block diagram showing a conventional EEPROM.
Figure 20:
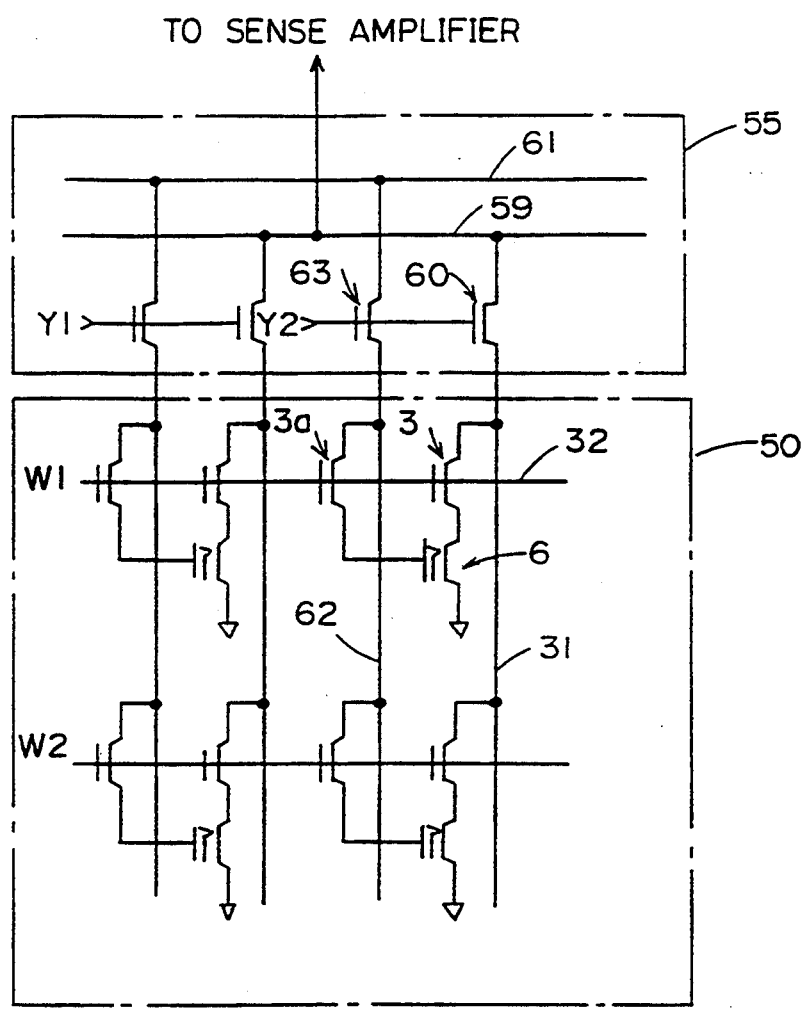
FIG. 20 is a circuit diagram showing a memory cell array and a Y gate.
Figure 21A:
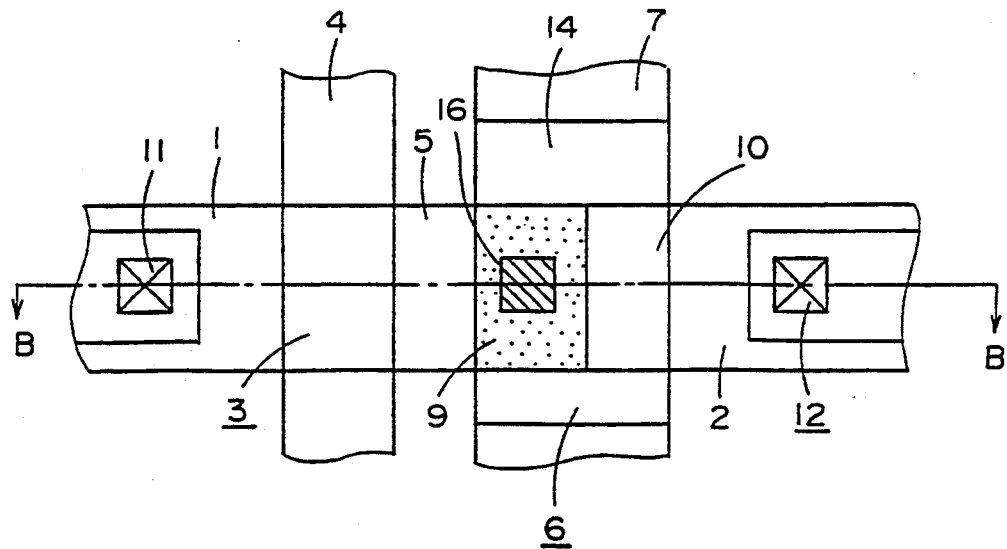
FIGS. 21(A) and 21(B) are a plan view and a cross sectional view showing a conventional EEPROM.
Figure 21B:
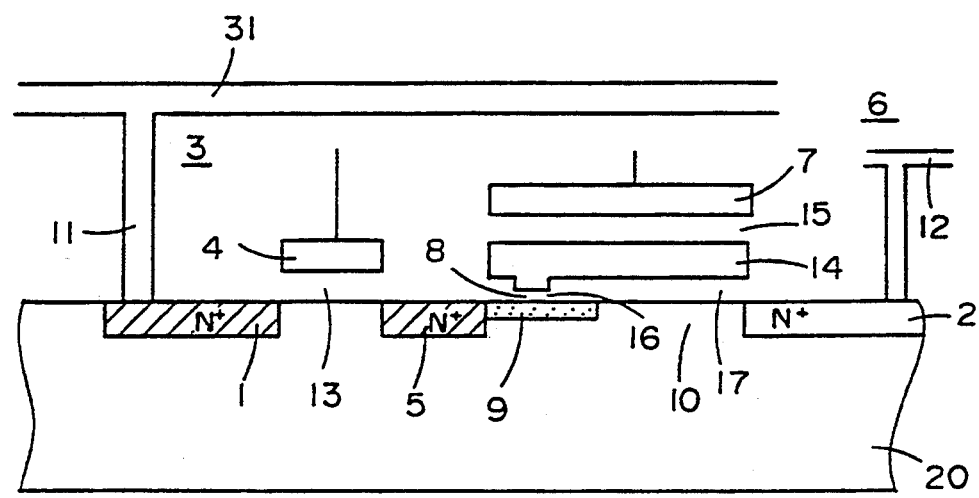
Figure 22A:
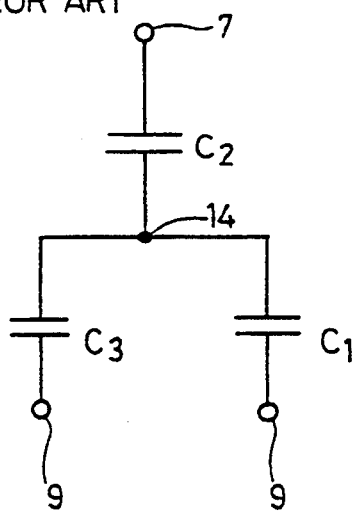
FIGS. 22(A) and 22(B) are equivalent circuit diagrams showing the EEPROM shown in FIG. 13.
Figure 22B:
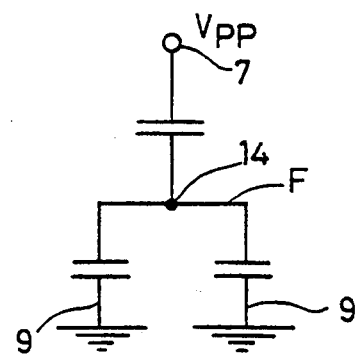
Figure 23A:
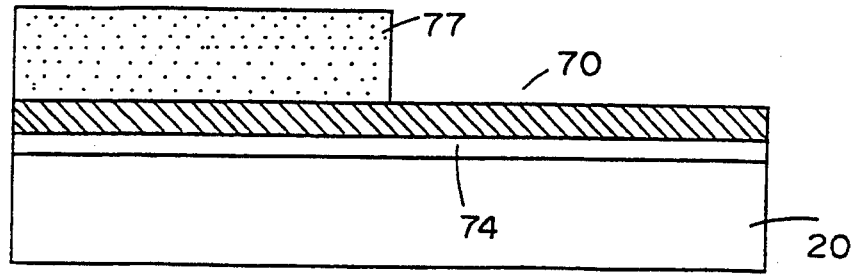
FIGS. 23(A)–23(D) are diagrams showing a manufacturing process of a conventional EEPROM.
Figure 23B:
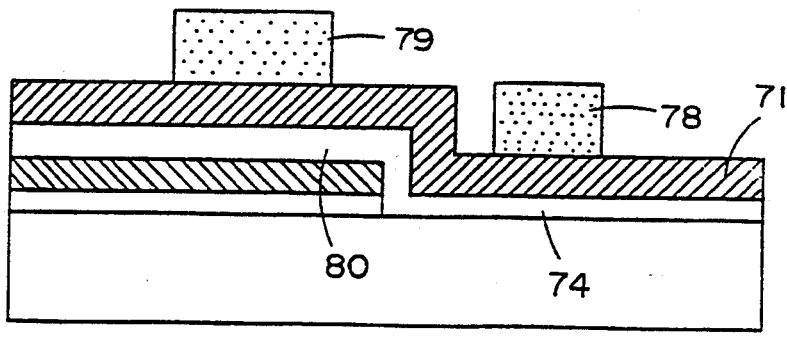
Figure 23C:
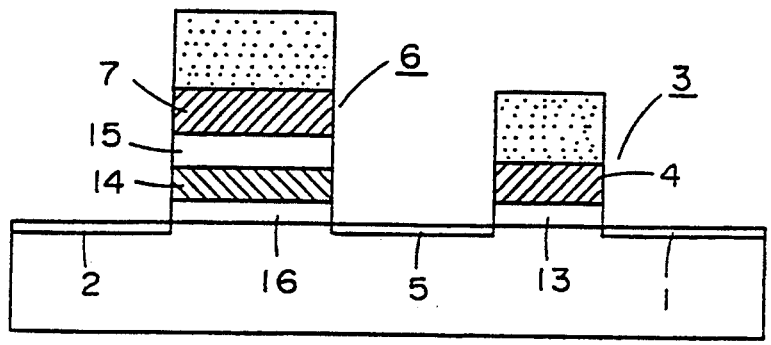
Figure 23D:
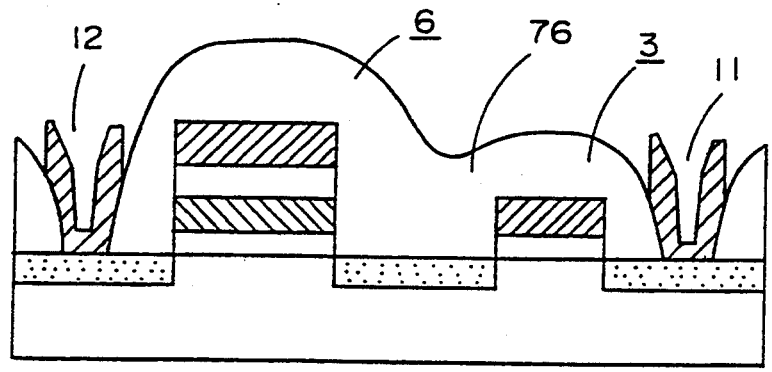
Figure 24:
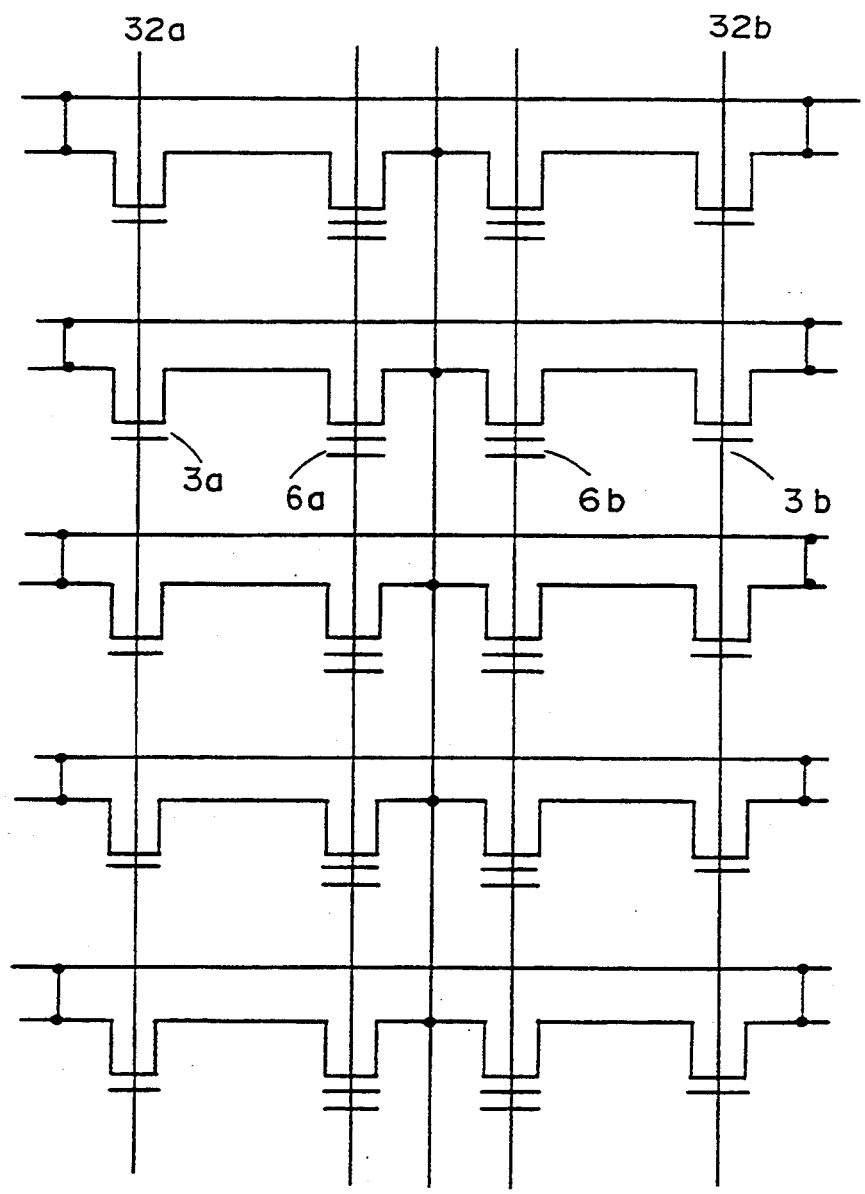
FIG. 24 is a circuit diagram showing a memory cell array formed of a conventional EEPROM.
Figure 25A:
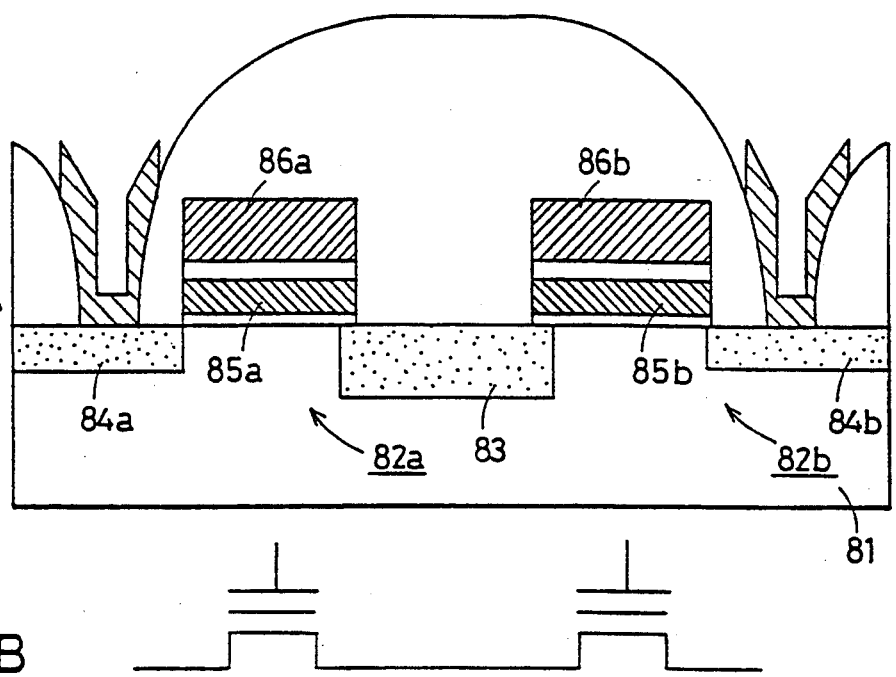
FIGS. 25A–25B are a cross sectional view showing a conventional flash type EEPROM and an equivalent circuit thereof.
Figure 25B:

FIG. 18 is a cross sectional view showing an EEPROM in accordance with a ninth embodiment of the present invention. Referring to FIG. 18, in this embodiment, selecting gate electrode 4 is provided only between first and second memory transistors 43 and 44. After forming a polycrystalline silicon film thicker than the height of the memory transistor, selecting gate electrode 4 is etched back to have a self-aligned arrangement to the memory transistor wherein selecting gate electrode 4 is not extend over control gates 7a, 7b.

As described above, in the ninth embodiment, since the gate electrode of the selecting transistor does not extend over the memory transistor, but arranged in a self-aligned manner to the memory transistor, the size of the device can be reduced without increasing step difference of the memory cell. Consequently, an EEPROM highly reliable and suitable for high density integration can be provided.

Operations in the second to ninth embodiments are basically the same as the first embodiment, description thereof will not be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An EEPROM comprising:
a semiconductor substrate having a main surface;

a pair of memory transistors formed spaced apart from each other on the main surface of said semiconductor substrate and each including a floating gate for storing information charges and a control gate for controlling said floating gate; and a selecting transistor, operating in synchronization with said control gate, formed on the main surface of said semiconductor substrate in said space for selecting said memory transistor and including a gate electrode formed parallel to the control gates of said pair of memory transistors.

2. An EEPROM as recited in claim 1, wherein a part of the gate electrode of said selecting transistor extends on said pair of memory transistors with an insulating film therebetween.

3. An EEPROM as recited in claim 2, wherein said control gate has a prescribed first thickness, and said insulating film has a second thickness larger than the first thickness.

4. An EEPROM as recited in claim 2, wherein said insulating film includes a silicon nitride film.

5. An EEPROM as recited in claim 2 further comprising a sidewall insulating film provided from said control gate to the main surface of said semiconductor substrate on the side where said selecting transistor of said pair of memory transistors is provided and increasing its thickness from said control gate toward the main surface of said semiconductor substrate.

6. An EEPROM as recited in claim 2, wherein the thickness of said gate electrode is at most 10 nm.

7. An EEPROM comprising:
a semiconductor substrate having a main surface;
a pair of memory transistors formed spaced apart from each other on the main surface of said semiconductor substrate and each including a floating gate for storing information charges and a control gate for controlling said floating gate; and
a selecting transistor, operating in synchronization with the control gates, formed on the main surface of said semiconductor substrate in said space for selecting said memory transistor and including a gate electrode formed parallel to the control gates of said pair of memory transistors with a part of the gate electrode extending on said pair of memory transistors with an insulating film therebetween, wherein
said gate electrode extends opposite to the side where said selecting transistor of said pair of memory transistors is formed.

8. An EEPROM as recited in claim 1, wherein said selecting transistor includes a pair of impurity diffusion regions formed on said main surface and in said space, and a gate electrode is provided between said impurity diffusion regions and on said main surface with an insulating film therebetween.

9. An EEPROM as recited in claim 1, wherein a recess is provided on said main surface and in said space, and said gate electrode is provided along said recess.

10. An EEPROM comprising:
a semiconductor substrate having a main surface;
a pair of memory transistors formed spaced apart from each other on the main surface of said semiconductor substrate and each including a floating gate for storing information charges and a control gate for controlling said floating gate; and a selecting transistor formed on the main surface of said semiconductor substrate in said space for selecting said memory transistor, wherein
said space has a first dimension,
said selecting transistor includes a gate electrode, and
the thickness of said gate electrode has a thickness of second dimension at least 178 of said first dimension.

11. An EEPROM as recited in claim 1, wherein said gate electrode is formed only in said space.

12. An EEPROM comprising:
a semiconductor substrate having a main surface;
a plurality of memory cell groups arranged in the directions of rows and columns on the main surface of said semiconductor substrate, wherein
said plurality of memory cell groups each includes a pair of memory cells formed spaced apart from each other each including a floating gate for storing information charges and a control gate, independently provided from said floating gate, for controlling said floating gate, and memory cell selecting means, operating in synchronization with the control gates, formed between the pair of memory cells for selecting one of said memory cells, said memory cell selecting means including a gate electrode formed parallel to the control gates of said pair of memory cells.

13. An EEPROM, comprising:
a semiconductor substrate having a main surface;
first and second memory transistors formed spaced apart from each other on the main surface of said semiconductor substrate, said first and second memory transistors each including a floating gate for storing informative charges and a control gate, independently provided from said floating gate, for controlling said floating gate; and
one selecting transistor, operating in synchronization with the control gates, formed between said first and second memory transistors and on said main surface for selecting said first or second memory transistors, said one selecting transistor including a gate electrode formed parallel to the control gates of said first and second memory transistors.

14. An EEPROM comprising:
a semiconductor substrate;
a plurality of first and second control lines arranged in rows and columns, said first control lines including control gate signal lines and word lines and said second control lines including bit lines; and
a plurality of memory cells, each memory cell including a gate electrode structure and first and second source/drain regions formed on opposite sides of said gate electrode structure in said substrate, said gate electrode structure including a select gate electrode formed on said substrate and a pair of stacked gate electrodes formed on opposite sides of said select gate, said stacked gate electrodes including a floating gate electrode formed on said substrate and a control gate electrode, independently provided from said floating gate, formed on said floating gate electrode,
said select gate electrode formed parallel to the control gates of said stacked gate electrodes and operating in synchronization with the control gates, said source/drain regions connected to said bit lines, said select gate electrodes connected to said control gate signal lines and said control gate electrodes connected to said word lines.

15. An EEPROM comprising:

a semiconductor substrate having a main surface;

selecting transistors formed in a plurality of rows and columns on the main surface of said semiconductor substrate each including a selecting gate electrode formed over a channel region of said substrate;

pairs of FAMOS memory transistors formed in pairs of rows on opposite sides of respective ones of said selecting transistors on the main surface of said semiconductor substrates, each including a floating gate for storing information charges, a control gate, independently provided from said floating gate, for controlling said floating gate, and a source/drain region formed in said main surface of said semiconductor substrate on a side of a respective control gate distal a respective selecting transistor, said selecting gate electrode formed parallel to the control gates of said pairs of FAMOS memory transistors and operating in synchronization with the control gates;

word lines formed in rows and connected to said gate electrodes of said selecting transistors in respective rows;

control lines formed in rows and connected to said control gates of respective ones of said FAMOS transistors; and bit lines formed in columns on said substrate, each alternatingly connected to source/drain regions of FAMOS transistors in pairs of adjacent columns.

16. An EEPROM comprising:

a semiconductor substrate having a main surface;

a pair of memory transistors formed spaced apart from each other on the main surface of said semiconductor substrate and each including a floating gate for storing information charges and a control gate for controlling said floating gate, each control gate of said pair of memory transistors having an upper surface, an inner side surface adjacent said space separating said pair of memory transistors and an outer side surface parallel to said inner side surface; and a selecting transistor, operating in synchronization with said control gate, formed on the main surface of said semiconductor substrate in said space for selecting said memory transistor, said selecting transistor including a gate electrode formed parallel to the control gates of said pair of memory transistors, and extending over only said inner side surface and a portion of said upper surface of each control gate in said parallel direction, with an insulating film therebetween.

17. An EEPROM as recited in claim 16, wherein said control gate has a prescribed first thickness, and said insulating film has a second thickness larger than the first thickness.

18. An EEPROM as recited in claim 16, wherein said insulating film includes a silicon nitride film.

19. An EEPROM as recited in claim 16, further comprising a sidewall insulating film provided from said control gate to the main surface of said semiconductor substrate on the side where said selecting transistor of said pair of memory transistors is provided and increasing its thickness from said control gate toward the main surface of said semiconductor substrate.

20. An EEPROM as recited in claim 16, wherein the thickness of said gate electrode is at most 10 nm.

21. An EEPROM as recited in claim 16, wherein said selecting transistor includes a pair of impurity diffusion regions formed on said main surface and in said space, and said gate electrode extends only between said impurity diffusion regions and on said main surface with an insulating film therebetween.

22. An EEPROM as recited in claim 16, wherein a recess is provided on said main surface and in said space, and said gate electrode is provided along said recess.

* * * * *